United States Patent
Yantchev

(10) Patent No.: US 12,249,971 B2
(45) Date of Patent: Mar. 11, 2025

(54) TRANSVERSELY-EXCITED FILM BULK ACOUSTIC RESONATORS WITH SOLIDLY MOUNTED RESONATOR (SMR) PEDESTALS

(71) Applicant: Murata Manufacturing Co., Ltd., Nagaokakyo (JP)

(72) Inventor: Ventsislav Yantchev, Sofia (BG)

(73) Assignee: MURATA MANUFACTURING CO., LTD., Nagaokakyo (JP)

(*) Notice: Subject to any disclaimer, the term of this patent is extended or adjusted under 35 U.S.C. 154(b) by 617 days.

(21) Appl. No.: 17/674,783

(22) Filed: Feb. 17, 2022

(65) Prior Publication Data

US 2022/0321082 A1   Oct. 6, 2022

Related U.S. Application Data

(63) Continuation-in-part of application No. 17/494,657, filed on Oct. 5, 2021.
(Continued)

(51) Int. Cl.
*H03H 3/02* (2006.01)
*H03H 9/02* (2006.01)
(Continued)

(52) U.S. Cl.
CPC .......... *H03H 3/02* (2013.01); *H03H 9/02228* (2013.01); *H03H 9/132* (2013.01);
(Continued)

(58) Field of Classification Search
CPC .......... H03H 3/02; H03H 9/132; H03H 9/174; H03H 9/175; H03H 2003/023; H03H 2003/025; Y10T 29/4942; B81B 3/0081
See application file for complete search history.

(56) References Cited

U.S. PATENT DOCUMENTS 5,204,575 A   4/1993   Kanda et al.
5,274,345 A   12/1993   Gau
(Continued)

FOREIGN PATENT DOCUMENTS

WO   2016017104   2/2016
WO   2018003273   1/2018

OTHER PUBLICATIONS

A. C. Guyette, "Theory and Design of Intrinsically Switched Multiplexers With Optimum Phase Linearity," in IEEE Transactions on Microwave Theory and Techniques, vol. 61, No. 9, pp. 3254-3264, Sep. 2013, doi: 10.1109/TMTT.2013.2274963. Sep. 2013.
(Continued)

*Primary Examiner* — Donghai D Nguyen
(74) *Attorney, Agent, or Firm* — ARENTFOX SCHIFF LLP

(57) ABSTRACT

An acoustic resonator is fabricated with a substrate having a substrate top surface and a piezoelectric plate having plate front and plate back surfaces. An acoustic Bragg reflector is sandwiched between the substrate top surface and the plate back surface. The reflector has a cavity with a top surface perimeter, and the acoustic Bragg reflector is configured to reflect shear acoustic waves at a resonance frequency of the acoustic resonator. The back surface is mounted on the cavity top surface perimeter except for a portion of the plate forming a diaphragm that spans the cavity. An interdigital transducer (IDT) is formed on the plate front surface such that interleaved fingers of the IDT are disposed on the diaphragm. Two or more layers of the acoustic Bragg reflector form pedestals that support the back surface of the plate opposite some or all interleaved fingers of the IDT.

21 Claims, 22 Drawing Sheets

Related U.S. Application Data

(60) Provisional application No. 63/169,874, filed on Apr. 2, 2021.

(51) Int. Cl.
*H03H 9/13* (2006.01)
*H03H 9/17* (2006.01)

(52) U.S. Cl.
CPC ............ *H03H 9/174* (2013.01); *H03H 9/175* (2013.01); *H03H 2003/023* (2013.01); *H03H 2003/025* (2013.01)

(56) References Cited

U.S. PATENT DOCUMENTS

| | | |
|---|---|---|
| 5,446,330 A | 8/1995 | Eda et al. |
| 5,552,655 A | 9/1996 | Stokes et al. |
| 5,726,610 A | 3/1998 | Allen et al. |
| 5,729,186 A | 3/1998 | Seki et al. |
| 5,853,601 A | 12/1998 | Krishaswamy |
| 6,172,582 B1 | 1/2001 | Hickernell |
| 6,271,617 B1 | 8/2001 | Yoneda et al. |
| 6,377,140 B1 | 4/2002 | Ehara et al. |
| 6,516,503 B1 | 2/2003 | Ikada et al. |
| 6,540,827 B1 | 4/2003 | Levy et al. |
| 6,570,470 B2 | 5/2003 | Maehara et al. |
| 6,707,229 B1 | 3/2004 | Martin |
| 6,710,514 B2 | 3/2004 | Ikada et al. |
| 6,833,774 B2 | 12/2004 | Abbott et al. |
| 7,009,468 B2 | 3/2006 | Kadota et al. |
| 7,345,400 B2 | 3/2008 | Nakao et al. |
| 7,372,115 B2 * | 5/2008 | Baney ............... B81B 3/0081 257/419 |
| 7,463,118 B2 | 12/2008 | Jacobsen |
| 7,535,152 B2 | 5/2009 | Ogami et al. |
| 7,684,109 B2 | 3/2010 | Godshalk et al. |
| 7,728,483 B2 | 6/2010 | Tanaka |
| 7,868,519 B2 | 1/2011 | Umeda |
| 7,941,103 B2 | 5/2011 | Iwamoto et al. |
| 7,965,015 B2 | 6/2011 | Tai et al. |
| 7,986,075 B2 * | 7/2011 | Asai ............... H03H 9/132 310/320 |
| 8,278,802 B1 | 10/2012 | Lee et al. |
| 8,294,330 B1 | 10/2012 | Abbott et al. |
| 8,344,815 B2 | 1/2013 | Yamanaka et al. |
| 8,816,567 B2 | 8/2014 | Zuo et al. |
| 8,829,766 B2 | 9/2014 | Milyutin et al. |
| 8,932,686 B2 | 1/2015 | Hayakawa et al. |
| 9,093,979 B2 | 7/2015 | Wang |
| 9,112,134 B2 | 8/2015 | Takahashi |
| 9,130,145 B2 | 9/2015 | Martin et al. |
| 9,148,121 B2 | 9/2015 | Inoue |
| 9,219,466 B2 | 12/2015 | Meltaus et al. |
| 9,276,557 B1 | 3/2016 | Nordquist et al. |
| 9,369,105 B1 | 6/2016 | Li et al. |
| 9,425,765 B2 | 8/2016 | Rinaldi |
| 9,525,398 B1 | 12/2016 | Olsson |
| 9,640,750 B2 | 5/2017 | Nakanishi et al. |
| 9,748,923 B2 | 8/2017 | Kando et al. |
| 9,762,202 B2 | 9/2017 | Thalmayr et al. |
| 9,780,759 B2 | 10/2017 | Kimura et al. |
| 9,837,984 B2 | 12/2017 | Khlat et al. |
| 10,079,414 B2 | 9/2018 | Guyette et al. |
| 10,187,039 B2 | 1/2019 | Komatsu et al. |
| 10,200,013 B2 | 2/2019 | Bower et al. |
| 10,211,806 B2 | 2/2019 | Bhattacharjee |
| 10,284,176 B1 | 5/2019 | Solal |
| 10,491,192 B1 | 11/2019 | Plesski et al. |
| 10,601,392 B2 | 3/2020 | Plesski et al. |
| 10,637,438 B2 | 4/2020 | Garcia et al. |
| 10,644,674 B2 | 5/2020 | Takamine |
| 10,756,697 B2 | 8/2020 | Plesski et al. |
| 10,790,802 B2 | 9/2020 | Yantchev et al. |
| 10,797,675 B2 | 10/2020 | Plesski |
| 10,812,048 B2 | 10/2020 | Nosaka |
| 10,819,309 B1 | 10/2020 | Turner et al. |
| 10,826,462 B2 | 11/2020 | Plesski et al. |
| 10,868,510 B2 | 12/2020 | Yantchev et al. |
| 10,868,512 B2 | 12/2020 | Garcia et al. |
| 10,868,513 B2 | 12/2020 | Yantchev |
| 10,911,017 B2 | 2/2021 | Plesski |
| 10,911,021 B2 | 2/2021 | Turner et al. |
| 10,911,023 B2 | 2/2021 | Turner |
| 10,917,070 B2 | 2/2021 | Plesski et al. |
| 10,917,072 B2 | 2/2021 | McHugh et al. |
| 10,985,726 B2 | 4/2021 | Plesski |
| 10,985,728 B2 | 4/2021 | Plesski et al. |
| 10,985,730 B2 | 4/2021 | Garcia |
| 10,992,282 B1 | 4/2021 | Plesski et al. |
| 10,992,283 B2 | 4/2021 | Plesski et al. |
| 10,992,284 B2 | 4/2021 | Yantchev |
| 10,998,877 B2 | 5/2021 | Turner et al. |
| 10,998,882 B2 | 5/2021 | Yantchev et al. |
| 11,003,971 B2 | 5/2021 | Plesski et al. |
| 11,114,996 B2 | 9/2021 | Plesski et al. |
| 11,114,998 B2 | 9/2021 | Garcia et al. |
| 11,139,794 B2 | 10/2021 | Plesski et al. |
| 11,143,561 B2 | 10/2021 | Plesski |
| 11,146,231 B2 | 10/2021 | Plesski |
| 11,146,232 B2 | 10/2021 | Yandrapalli et al. |
| 11,146,238 B2 | 10/2021 | Hammond et al. |
| 11,146,244 B2 | 10/2021 | Yantchev |
| 11,165,407 B2 | 11/2021 | Yantchev |
| 11,171,629 B2 | 11/2021 | Turner |
| 11,728,785 B2 * | 8/2023 | Turner .................. H03H 9/174 333/186 |
| 2002/0079986 A1 | 6/2002 | Ruby et al. |
| 2002/0130736 A1 | 9/2002 | Mukai |
| 2002/0158714 A1 | 10/2002 | Kaitila et al. |
| 2002/0189062 A1 | 12/2002 | Lin et al. |
| 2003/0042998 A1 | 3/2003 | Edmonson |
| 2003/0080831 A1 | 5/2003 | Naumenko et al. |
| 2003/0199105 A1 | 10/2003 | Kub et al. |
| 2004/0041496 A1 | 3/2004 | Imai et al. |
| 2004/0100164 A1 | 5/2004 | Murata |
| 2004/0261250 A1 | 12/2004 | Kadota et al. |
| 2005/0077982 A1 | 4/2005 | Funasaka |
| 2005/0185026 A1 | 8/2005 | Noguchi et al. |
| 2005/0218488 A1 | 10/2005 | Matsuo |
| 2005/0264136 A1 | 12/2005 | Tsutsumi et al. |
| 2006/0152107 A1 | 7/2006 | Tanaka |
| 2006/0179642 A1 | 8/2006 | Kawamura |
| 2007/0182510 A1 | 8/2007 | Park |
| 2007/0188047 A1 | 8/2007 | Tanaka |
| 2007/0194863 A1 | 8/2007 | Shibata et al. |
| 2007/0267942 A1 | 11/2007 | Matsumoto et al. |
| 2008/0246559 A1 | 10/2008 | Ayazi |
| 2010/0019866 A1 | 1/2010 | Hara et al. |
| 2010/0064492 A1 | 3/2010 | Tanaka |
| 2010/0123367 A1 | 5/2010 | Tai et al. |
| 2011/0018389 A1 | 1/2011 | Fukano et al. |
| 2011/0018654 A1 | 1/2011 | Bradley et al. |
| 2011/0109196 A1 | 5/2011 | Goto et al. |
| 2011/0278993 A1 | 11/2011 | Iwamoto |
| 2012/0073390 A1 | 3/2012 | Zaghloul et al. |
| 2012/0198672 A1 | 8/2012 | Ueda et al. |
| 2012/0286900 A1 | 11/2012 | Kadota et al. |
| 2012/0326809 A1 | 12/2012 | Tsuda |
| 2013/0127551 A1 | 5/2013 | Yamanaka |
| 2013/0234805 A1 | 9/2013 | Takahashi |
| 2013/0271238 A1 | 10/2013 | Onda |
| 2013/0278609 A1 | 10/2013 | Stephanou et al. |
| 2013/0321100 A1 | 12/2013 | Wang |
| 2014/0130319 A1 | 5/2014 | Iwamoto |
| 2014/0145556 A1 | 5/2014 | Kadota |
| 2014/0151151 A1 | 6/2014 | Reinhardt |
| 2014/0152145 A1 | 6/2014 | Kando et al. |
| 2014/0173862 A1 | 6/2014 | Kando et al. |
| 2014/0225684 A1 | 8/2014 | Kando et al. |
| 2015/0042417 A1 | 2/2015 | Onodera et al. |
| 2015/0165479 A1 | 6/2015 | Lasiter et al. |
| 2015/0319537 A1 | 11/2015 | Perois et al. |
| 2015/0333730 A1 | 11/2015 | Meltaus et al. |
| 2015/0365067 A1 | 12/2015 | Hori et al. |

(56) References Cited

U.S. PATENT DOCUMENTS

| | | |
|---|---|---|
| 2016/0028367 A1 | 1/2016 | Shealy |
| 2016/0087187 A1 | 3/2016 | Burak |
| 2016/0182009 A1 | 6/2016 | Bhattacharjee |
| 2017/0063332 A1 | 3/2017 | Gilbert et al. |
| 2017/0179225 A1 | 6/2017 | Kishimoto |
| 2017/0179928 A1 | 6/2017 | Raihn et al. |
| 2017/0214381 A1 | 7/2017 | Bhattacharjee |
| 2017/0214387 A1 | 7/2017 | Burak et al. |
| 2017/0222617 A1 | 8/2017 | Mizoguchi |
| 2017/0222622 A1 | 8/2017 | Solal et al. |
| 2017/0370791 A1 | 12/2017 | Nakamura et al. |
| 2018/0005950 A1 | 1/2018 | Watanabe |
| 2018/0026603 A1 | 1/2018 | Iwamoto |
| 2018/0033952 A1 | 2/2018 | Yamamoto |
| 2018/0041191 A1 | 2/2018 | Park |
| 2018/0062615 A1 | 3/2018 | Kato et al. |
| 2018/0062617 A1 | 3/2018 | Yun et al. |
| 2018/0123016 A1 | 5/2018 | Gong |
| 2018/0191322 A1 | 7/2018 | Chang et al. |
| 2018/0278227 A1 | 9/2018 | Hurwitz |
| 2019/0068164 A1 | 2/2019 | Houlden et al. |
| 2019/0123721 A1 | 4/2019 | Takamine |
| 2019/0131953 A1 | 5/2019 | Gong |
| 2019/0273480 A1 | 9/2019 | Lin et al. |
| 2019/0348966 A1 | 11/2019 | Campanella-Pineda |
| 2019/0379351 A1 | 12/2019 | Miyamoto et al. |
| 2019/0386635 A1 | 12/2019 | Plesski et al. |
| 2019/0386636 A1 | 12/2019 | Plesski et al. |
| 2020/0007110 A1 | 1/2020 | Konaka et al. |
| 2020/0021272 A1 | 1/2020 | Segovia Fernandez et al. |
| 2020/0036357 A1 | 1/2020 | Mimura |
| 2020/0235719 A1 | 7/2020 | Yantchev et al. |
| 2020/0259480 A1 | 8/2020 | Pensala |
| 2020/0313645 A1 | 10/2020 | Caron |
| 2020/0350891 A1 | 11/2020 | Turner |
| 2021/0013859 A1 | 1/2021 | Turner et al. |
| 2021/0265978 A1 | 8/2021 | Plesski et al. |
| 2021/0328574 A1 | 10/2021 | Garcia |
| 2021/0351762 A1 | 11/2021 | Dyer et al. |

OTHER PUBLICATIONS

Acoustic Properties of Solids ONDA Corporation 592 Weddell Drive, Sunnyvale, CA 94089, Apr. 11, 2003, pp. 5 (Year 2003). 2003.

Bahreyni, B. Fabrication and Design of Resonant Microdevices Andrew William, Inc. 2018, NY (Year 2008). 2008.

Buchanan "Ceramic Materials for Electronics" 3rd Edition, first published in 2004 by Marcel Dekker, Inc. pp. 496 (Year 2004). 00 Jan. 2004.

Ekeom, D. & Dubus, Bertrand & Volatier, A . . . (2006). Solidly mounted resonator (SMR) FEM-BEM simulation. 1474-1477. 10.1109/ULTSYM.2006.371.

G. Manohar, "Investigation of Various Surface Acoustic Wave Design Configurations for Improved Sensitivity." Doctoral dissertation, University of South Florida, USA, Jan. 2012, 7 pages.

Kadota et al. "5.4 Ghz Lamb Wave Resonator on LiNbO3 Thin Crystal Plate and Its Application," published in Japanese Journal of Applied Physics 50 (2011) 07HD11. (Year: 2011) 2011.

M. Kadota et al.; "Ultrawide Band Ladder Filter using SH0 plate Wave in Thin LiNb03 Plate and its Application"; 2014 IEEE International Ultrasonics Symposium Proceedings, 2014, pp. 2031-2034. (Year: 2014).

M. Kadota, S. Tanaka, "Wideband acoustic wave resonators composed of hetero acoustic layer structure," Japanese Journal of Applied Physics, vol. 57, No. 7S1. Published Jun. 5, 2018. 5 pages.

M.-H. Li et al.; "Temperature Stability Analysis of Thin-Film Lithium Niobate SH0 Plate Wave Resonators"; Journal of Microelectromechanical Systems, vol. 28, No. 5, Oct. 2019, pp. 799-809. (Year: 2019).

Material Properties of Tibtech Innovations, © 2018 Tibtech Innovations (Year 2018). 2018.

Merriam Webster, dictionary meaning of the word "diaphragm", since 1828, Merriam Webster (Year: 1828) 1828.

Mizutaui, K. and Toda, K., "Analysis of lamb wave propagation characteristics in rotated Ycut Xpropagation LiNbO3 plates." Electron. Comm. Jpn. Pt. I, 69, No. 4 (1986): 47-55. doi:10.1002/ecja.4410690406.

Moussa et al. Review on Triggered Liposomal Drug Delivery with a Focus on Ultrasound 2015, Bentham Science Publishers, pp. 16 (Year 2005) 2005.

Namdeo et al. "Simulation on Effects of Electrical Loading due to Interdigital Transducers in Surface Acoustic Wave Resonator", published in Procedia Engineering 64 ( 2013) of Science Direct pp. 322-330 (Year: 2013) 2013.

Naumenko et al., "Optimal orientations of Lithium Niobate for resonator SAW filters", 2003 IEEE Ultrasonics Symposium—pp. 2110-2113. (Year: 2003).

R. Olsson III, K. Hattar et al. "A high electromechanical coupling coefficient SH0 Lamb wave lithiumniobate micromechanical resonator and a method for fabrication" Sensors and Actuators A: Physical, vol. 209, Mar. 1, 2014, pp. 183-190.

Rodriguez-Madrid et al., "Super-High-Frequency SAW Resonators on AlN/Diamond", IEEE Electron Device Letters, vol. 33, No. 4, Apr. 2012, pp. 495-497. Year: 2012) 2012.

Safari et al. "Piezoelectric for Transducer Applications" published by Elsevier Science Ltd., pp. 4 (Year: 2000). 2020.

Santosh, G. , Surface acoustic wave devices on silicon using patterned and thin film ZnO, Ph.D. thesis, Feb. 2016, Indian Institute of technology Guwahati, Assam, India Feb. 2016.

Sorokin et al.Study of Microwave Acoustic Attenuation in a Multifrequency Bulk Acoustic Resonator Based on a Synthetic Diamond Single CrystalPublished in Acoustical Physics, vol. 61, No. 6, 2015 pp. 675 (Year 2015) 00 Jan. 2015.

T. Takai, H. Iwamoto, et al., "I.H.P.Saw Technology and its Application to Microacoustic Components (Invited)." 2017 IEEE International Ultrasonics Symposium, Sep. 6-9, 2017. pp. 1-8.

USPTO/ISA, International Search Report and Written Opinion for PCT Application No. PCT/US2019/036433 dated Aug. 29, 2019.

USPTO/ISA, International Search Report and Written Opinion for PCT Application No. PCT/US2019/058632 dated Jan. 17, 2020.

USPTO/ISA, International Search Report and Written Opinion for PCT Application No. PCT/US2020/45654 dated Oct. 29, 2020.

USPTO/ISA, International Search Report and Written Opinion for PCT Application No. PCT/US2021/024824 dated Jul. 27, 2021, 9 total pages.

USPTO/ISA, International Search Report and Written Opinion for PCT Application No. PCT/US2021/048505 dated Dec. 1, 2021, 11 total pages.

Y. Yang, A. Gao et al. "5 GHZ Lithium Niobate MEMS Resonators With High FOM of 153", 2017 IEEE 30th International Conference in Micro Electro Mechanical Systems (MEMS). Jan. 22-26, 2017. pp. 942-945.

Y. Yang, R. Lu et al. "Towards Ka Band Acoustics: Lithium Niobat Asymmetrical Mode Piezoelectric MEMS Resonators", Department of Electrical and Computer Engineering University of Illinois at Urbana-Champaign, May 2018. pp. 1-2.

Yanson Yang, Ruochen Lu, Songbin Gong, High Q Antisymmetric Mode Lithium Niobate MEMS Resonators With Spurious Mitigation, Journal of Microelectromechanical Systems, vol. 29, No. 2, Apr. 2020. Apr. 2, 2020.

Yu-Po Wong, Luyan Qiu, Naoto Matsuoka, Ken-ya Hashimoto, Broadband Piston Mode Operation for First-order Antisymmetric Mode Resonators, 2020 IEEE International Ultrasonics Symposium, Sep. 2020. Sep. 2020.

Zou, Jie "High-Performance Aluminum Nitride Lamb Wave Resonators for RF Front-End Technology" University of California, Berkeley, Summer 2015, pp. 63 (Year 2015) 00 Jan. 2015.

* cited by examiner

DETAIL C

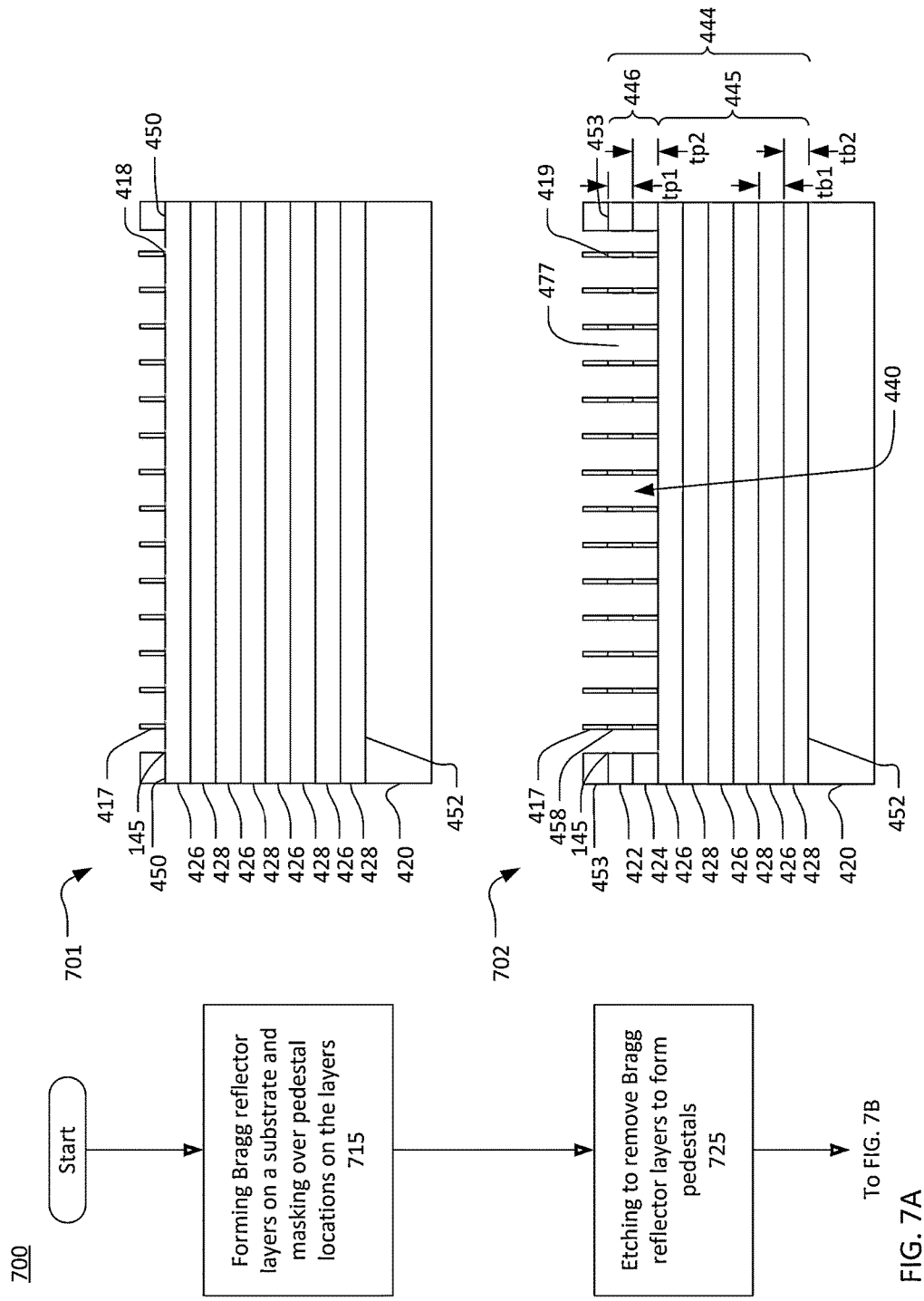

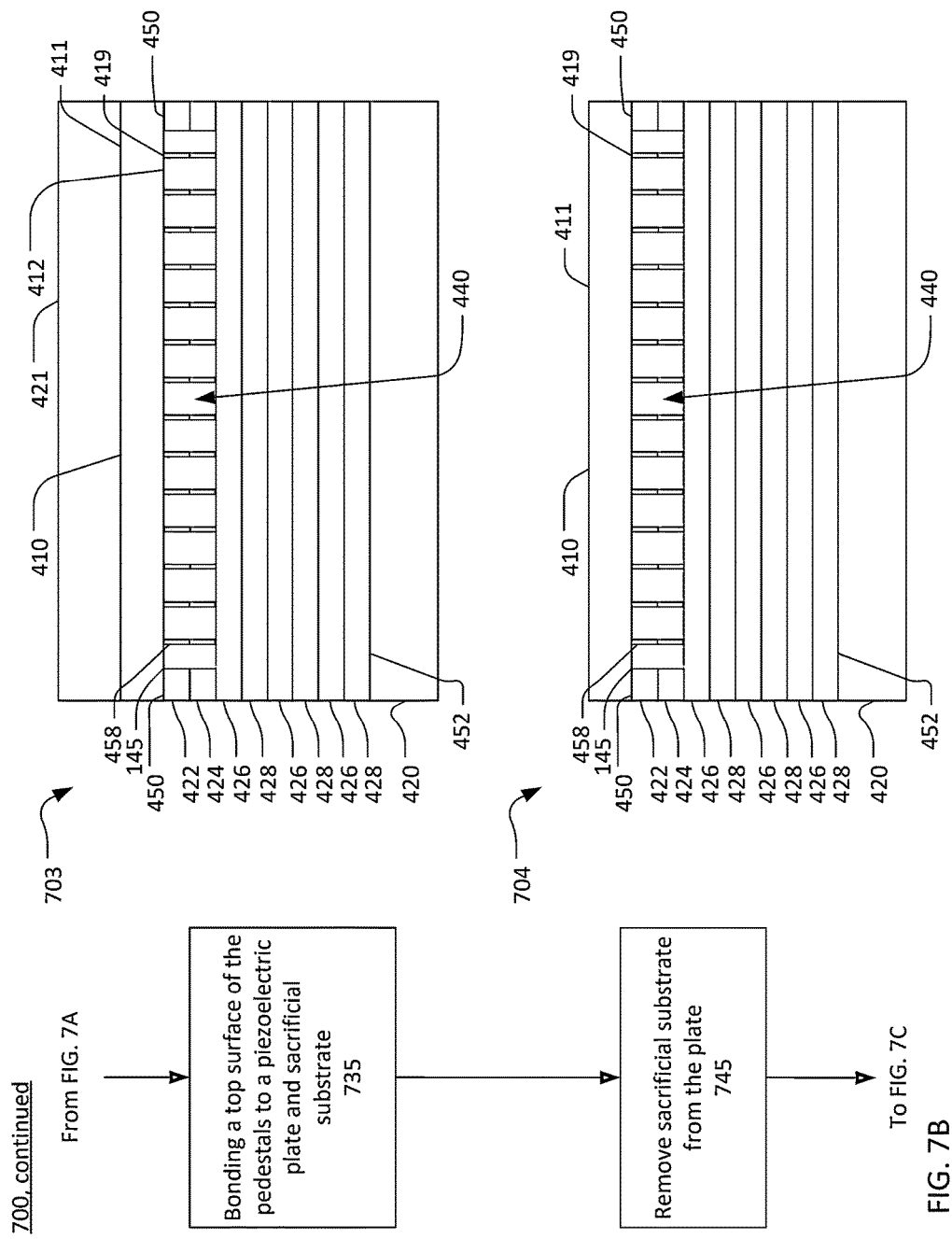

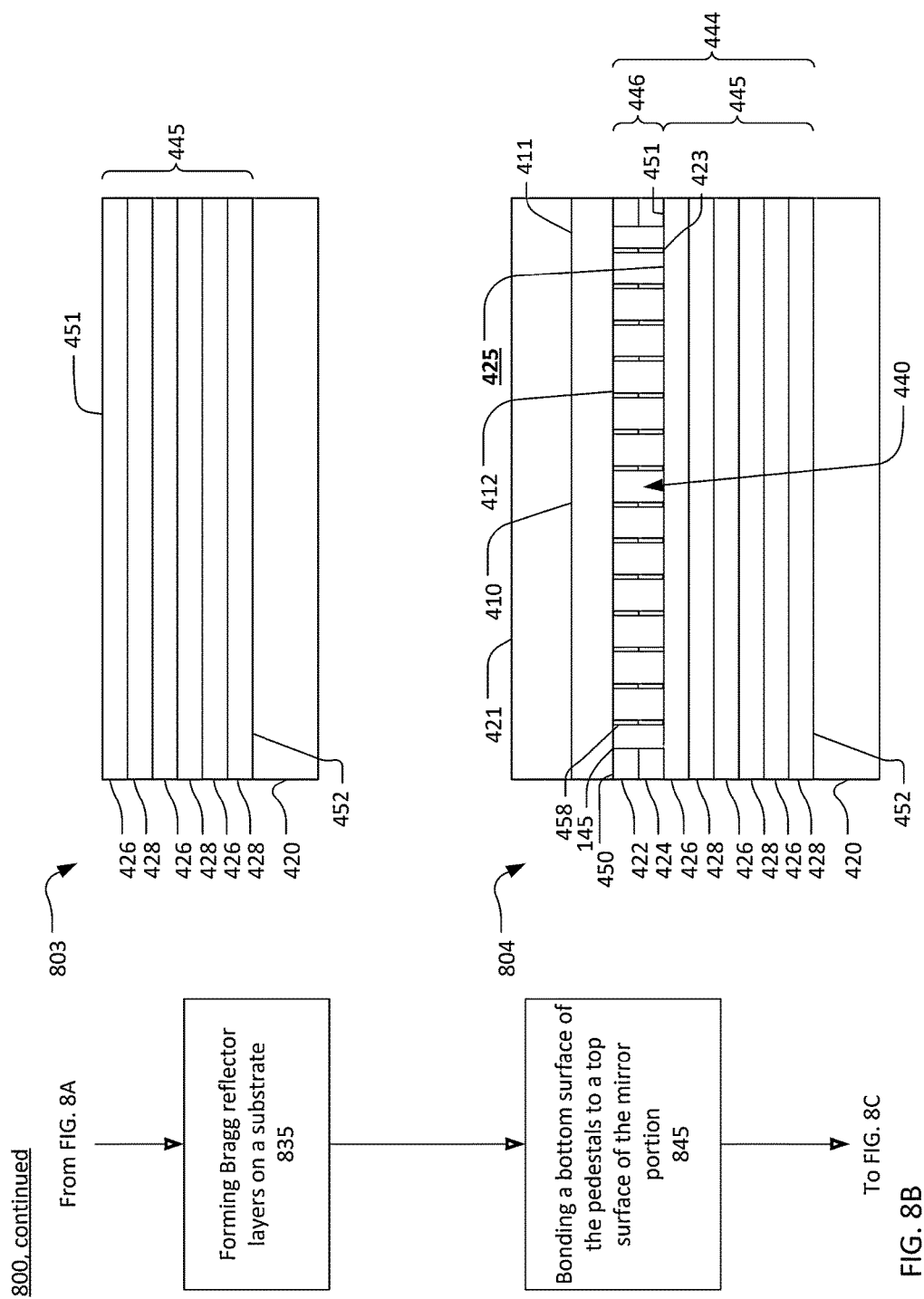

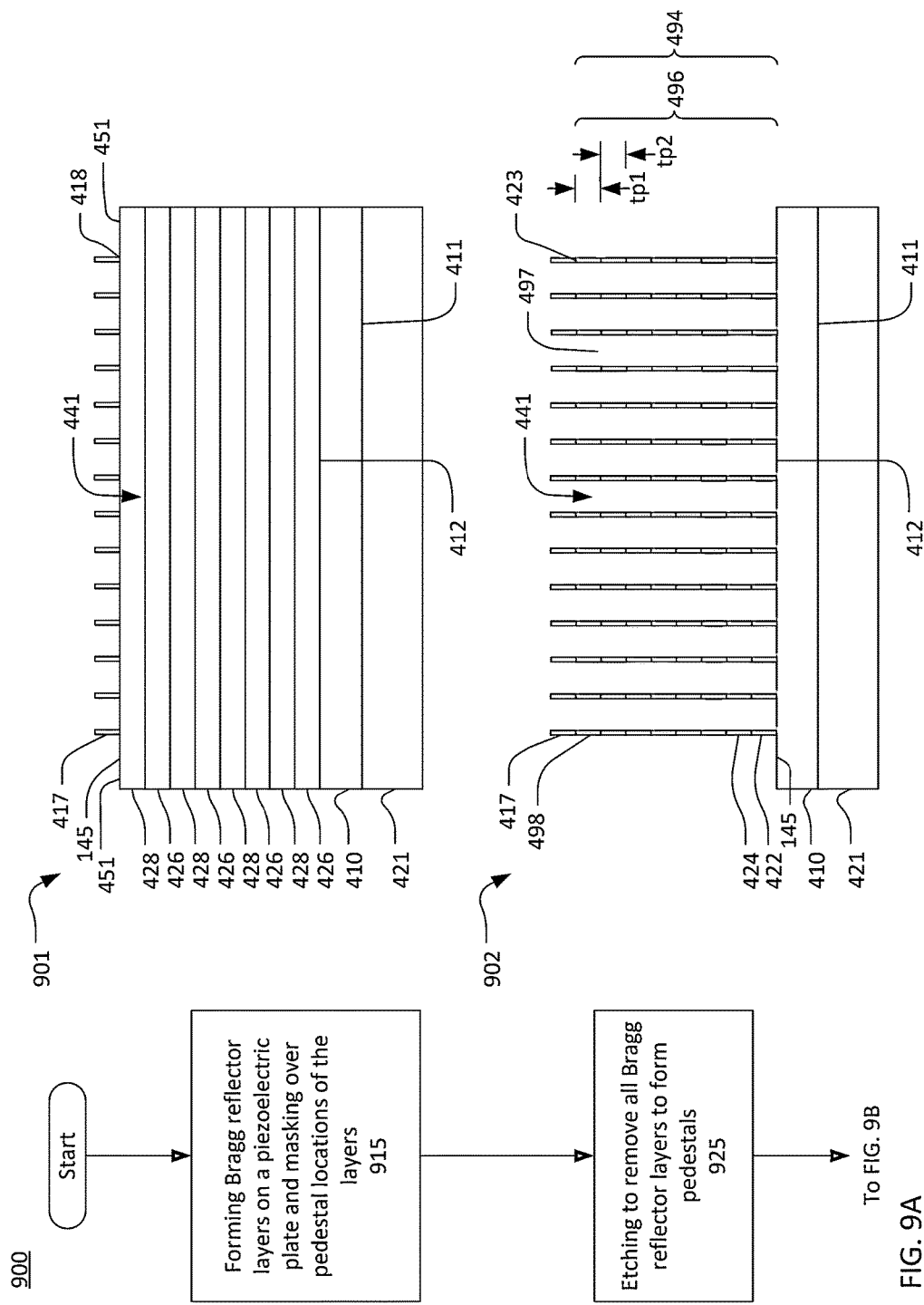

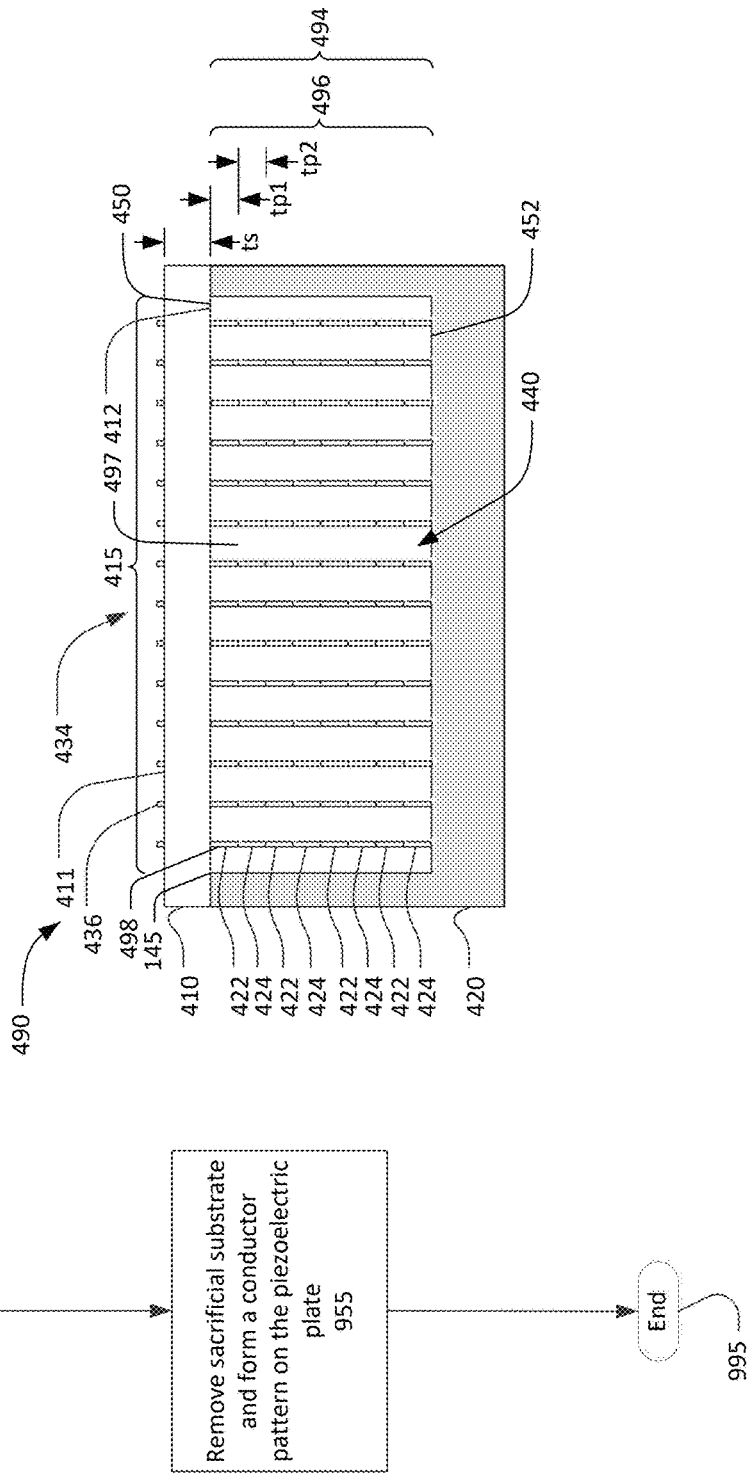

TRANSVERSELY-EXCITED FILM BULK ACOUSTIC RESONATORS WITH SOLIDLY MOUNTED RESONATOR (SMR) PEDESTALS

RELATED APPLICATION INFORMATION

This patent is a continuation-in-part of application Ser. No. 17/494,657, filed Oct. 5, 2021, titled TRANSVERSELY-EXCITED FILM BULK ACOUSTIC RESONATORS WITH SOLIDLY MOUNTED RESONATOR (SMR) PEDESTALS, which claims priority to Provisional Patent Application No. 63/169,874, filed Apr. 2, 2021, entitled XBARS WITH SMR PEDESTALS, which are incorporated herein by reference.

A portion of the disclosure of this patent document contains material which is subject to copyright protection. This patent document may show and/or describe matter which is or may become trade dress of the owner. The copyright and trade dress owner has no objection to the facsimile reproduction by anyone of the patent disclosure as it appears in the Patent and Trademark Office patent files or records, but otherwise reserves all copyright and trade dress rights whatsoever.

BACKGROUND

Field

This disclosure relates to radio frequency filters using acoustic wave resonators, and specifically to filters for use in communications equipment.

Description of the Related Art

A radio frequency (RF) filter is a two-port device configured to pass some frequencies and to stop other frequencies, where "pass" means transmit with relatively low signal loss and "stop" means block or substantially attenuate. The range of frequencies passed by a filter is referred to as the "pass-band" of the filter. The range of frequencies stopped by such a filter is referred to as the "stop-band" of the filter. A typical RF filter has at least one pass-band and at least one stop-band. Specific requirements on a passband or stop-band depend on the specific application. For example, a "pass-band" may be defined as a frequency range where the insertion loss of a filter is better than a defined value such as 1 dB, 2 dB, or 3 dB. A "stop-band" may be defined as a frequency range where the rejection of a filter is greater than a defined value such as 20 dB, 30 dB, 40 dB, or greater depending on application.

RF filters are used in communications systems where information is transmitted over wireless links. For example, RF filters may be found in the RF front-ends of cellular base stations, mobile telephone and computing devices, satellite transceivers and ground stations, IoT (Internet of Things) devices, laptop computers and tablets, fixed point radio links, and other communications systems. RF filters are also used in radar and electronic and information warfare systems.

RF filters typically require many design trade-offs to achieve, for each specific application, the best compromise between performance parameters such as insertion loss, rejection, isolation, power handling, linearity, size and cost. Specific design and manufacturing methods and enhancements can benefit simultaneously one or several of these requirements.

Performance enhancements to the RF filters in a wireless system can have broad impact to system performance. Improvements in RF filters can be leveraged to provide system performance improvements such as larger cell size, longer battery life, higher data rates, greater network capacity, lower cost, enhanced security, higher reliability, etc. These improvements can be realized at many levels of the wireless system both separately and in combination, for example at the RF module, RF transceiver, mobile or fixed sub-system, or network levels.

High performance RF filters for present communication systems commonly incorporate acoustic wave resonators including surface acoustic wave (SAW) resonators, bulk acoustic wave (BAW) resonators, film bulk acoustic wave resonators (FBAR), and other types of acoustic resonators. However, these existing technologies are not well-suited for use at the higher frequencies and bandwidths proposed for future communications networks.

The desire for wider communication channel bandwidths will inevitably lead to the use of higher frequency communications bands. Radio access technology for mobile telephone networks has been standardized by the 3GPP ($3^{rd}$ Generation Partnership Project). Radio access technology for $5^{th}$ generation mobile networks is defined in the 5G NR (new radio) standard. The 5G NR standard defines several new communications bands. Two of these new communications bands are n77, which uses the frequency range from 3300 MHz to 4200 MHz, and n79, which uses the frequency range from 4400 MHz to 5000 MHz. Both band n77 and band n79 use time-division duplexing (TDD), such that a communications device operating in band n77 and/or band n79 use the same frequencies for both uplink and downlink transmissions. Bandpass filters for bands n77 and n79 must be capable of handling the transmit power of the communications device. WiFi bands at 5 GHz and 6 GHz also require high frequency and wide bandwidth. The 5G NR standard also defines millimeter wave communication bands with frequencies between 24.25 GHz and 40 GHz.

The Transversely-Excited Film Bulk Acoustic Resonator (XBAR) is an acoustic resonator structure for use in microwave filters. The XBAR is described in U.S. Pat. No. 10,491,291, titled TRANSVERSELY EXCITED FILM BULK ACOUSTIC RESONATOR. An XBAR resonator comprises an interdigital transducer (IDT) formed on a thin floating layer, or diaphragm, of a single-crystal piezoelectric material. The IDT includes a first set of parallel fingers, extending from a first busbar and a second set of parallel fingers extending from a second busbar. The first and second sets of parallel fingers are interleaved. A microwave signal applied to the IDT excites a shear primary acoustic wave in the piezoelectric diaphragm. XBAR resonators provide very high electromechanical coupling and high frequency capability. XBAR resonators may be used in a variety of RF filters including band-reject filters, band-pass filters, duplexers, and multiplexers. XBARs are well suited for use in filters for communications bands with frequencies above 3 GHz.

DESCRIPTION OF THE DRAWINGS

FIGS. 7A, 7B and 7C (collectively "FIG. 7") are a flow chart of a process for fabricating XBARs with SMR pedestals.

FIGS. 8A, 8B and 8C (collectively "FIG. 8") are a flow chart of a process for fabricating XBARs with SMR pedestals.

FIGS. 9A, 9B and 9C (collectively "FIG. 9") are a flow chart of a process for fabricating XBARs with SMR pedestals.

Figure 1:
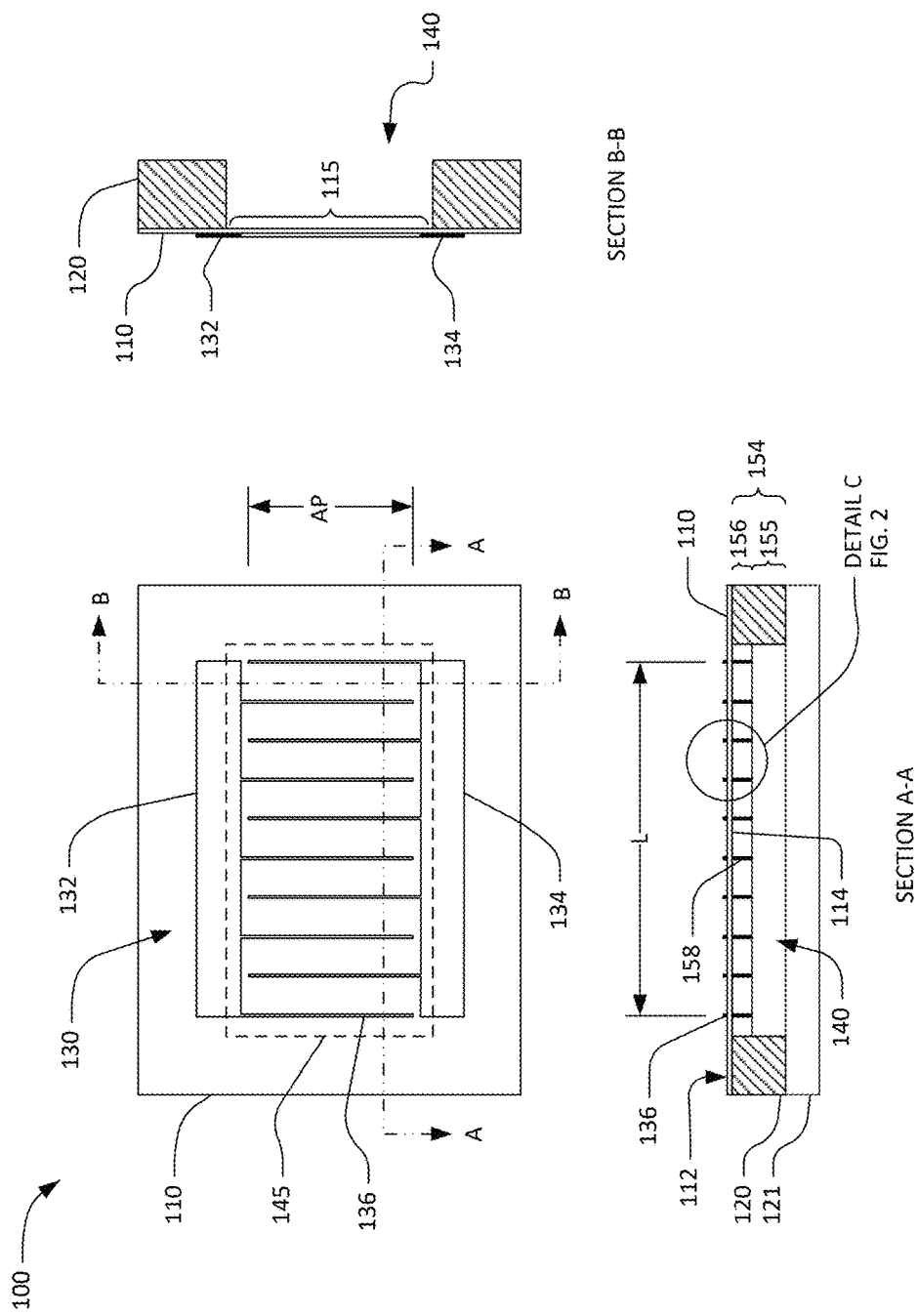
FIG. 1 includes a schematic plan view and two schematic cross-sectional views of a transversely-excited film bulk acoustic resonator (XBAR).

Throughout this description, elements appearing in figures are assigned three-digit or four-digit reference designators, where the two least significant digits are specific to the element and the one or two most significant digit is the figure number where the element is first introduced. An element that is not described in conjunction with a figure may be presumed to have the same characteristics and function as a previously-described element having the same reference designator or the same two least significant digits.

DETAILED DESCRIPTION

Description of Apparatus

The Transversely-Excited Film Bulk Acoustic Resonator (XBAR) is a new resonator structure for use in microwave filters. The XBAR is described in U.S. Pat. No. 10,491,291, titled TRANSVERSELY EXCITED FILM BULK ACOUSTIC RESONATOR, which is incorporated herein by reference in its totality. An XBAR resonator comprises a conductor pattern having an interdigital transducer (IDT) formed on a thin floating layer or diaphragm of a piezoelectric material. The IDT has two busbars which are each attached to a set of fingers and the two sets of fingers are interleaved on the diaphragm over a cavity formed in a substrate upon which the resonator is mounted. The diaphragm spans the cavity and may include front-side and/or back-side dielectric layers. A microwave signal applied to the IDT excites a shear primary acoustic wave in the piezoelectric diaphragm, such that the acoustic energy flows substantially normal to the surfaces of the layer, which is orthogonal or transverse to the direction of the electric field generated by the IDT. XBAR resonators provide very high electromechanical coupling and high frequency capability.

A piezoelectric membrane may be a part of a plate of single-crystal piezoelectric material that spans a cavity in the substrate. A piezoelectric diaphragm may be the membrane and may include the front-side and/or back-side dielectric layers. An XBAR resonator may be such a diaphragm or membrane with an interdigital transducer (IDT) formed on a diaphragm or membrane.

Bandpass filters commonly use a ladder filter circuit that includes one or more series resonator connected in series between an input and an output of the filter and one or more shunt resonators, each connected between ground and one of the input, the output, or a node between two series resonators. The resonance frequencies of the shunt resonators are lower than the resonance frequencies of the series resonators. Often, the resonance frequencies of the shunt resonators are located below a lower edge of a passband of the filter and the antiresonance frequencies of series resonators are located above an upper edge of the passband.

Conventional XBAR resonators use a thin piezoelectric diaphragm spanning a cavity in a substrate; the diaphragm is fragile and may distort and/or deform with varying temperature. For example, the planar shape of the diaphragm may deform by forming bumps and troughs (e.g., a ruffled potato chip cross-sectional shape) due to thermal expansion when it exceeds a certain temperature. To avoid such deformation, the diaphragm may be supported with pedestals reaching to the substrate, but large acoustic loses from the diaphragm, through the pedestals and to the substrate must be reduced or eliminated.

Diaphragm distortion is not a problem in solidly-mounted XBARs where the piezoelectric plate is supported by a blanket layered Bragg reflector and thus does not have a cavity. An acoustic Bragg reflector reflects shear acoustic waves produced by the diaphragm to keep the acoustic energy predominantly confined to the diaphragm, such as from being absorbed by the substrate.

However, the blanket layered Bragg reflector requires a high impedance ratio between reflective layers and fully dielectric layers, with at least one of them having low dielectric permittivity. Some material layer combinations satisfying these conditions are SiO2/Diamond and SiOC/Si3N4. These combinations are not necessarily practical because processes for forming thin, precisely-controlled films of either diamond or SiOC are not currently available.

Described herein are devices having and methods of forming XBARs with solidly mounted resonator (SMR) pedestals supporting the piezoelectric membrane (e.g., diaphragm) of the XBARs. Embodiments presented here include an acoustic Bragg reflector sandwiched between the substrate and a back surface of the piezoelectric diaphragm, where the acoustic Bragg reflector configured to reflect shear acoustic waves at a resonance frequency of the acoustic resonator device. Two or four layers of the acoustic Bragg reflector form SMR pedestals that are attached to and support the back surface of the piezoelectric plate opposite some or all interleaved fingers of the IDT. The pedestals support the back surface of the piezoelectric diaphragm and the piezoelectric diaphragm only spans the spaces between adjacent pedestals and IDT fingers, guaranteeing an increased rigidity of the XBAR structure. The increased support and/or rigidity decreases distortion and/or deformation of the diaphragm with varying temperature, while still providing high electromechanical coupling (e.g., a high ratio of conversion of electrical energy to acoustic energy) and high frequency capability. The Pedestals further provide a path for thermal cooling of the XBAR in combination with thick Al IDT electrodes (used in high power XBARs). In addition, to the pedestals providing mechanical support for the very thin diaphragm, they may provide a thermally conductive path for heat to flow from the diaphragm and IDT electrodes to the substrate.

FIG. 1 shows a simplified schematic top view and orthogonal cross-sectional views of a transversely-excited film bulk acoustic resonator (XBAR) 100. XBAR resonators such as the resonator 100 may be used in a variety of RF filters including band-reject filters, band-pass filters, duplexers, and multiplexers. XBARs are particularly suited for use in filters for communications bands with frequencies above 3 GHz.

The XBAR 100 is made up of a thin film conductor pattern formed on a surface of a piezoelectric plate 110 having parallel front and back surfaces 112, 114, respectively. The piezoelectric plate 110 is a thin single-crystal layer of a piezoelectric material such as lithium niobate, lithium tantalate, lanthanum gallium silicate, gallium nitride, or aluminum nitride. The piezoelectric plate is cut such that the orientation of the X, Y, and Z crystalline axes with respect to the front and back surfaces is known and consistent. In the examples presented, the piezoelectric plates may be Z-cut, which is to say the Z axis is normal to the surfaces. However, XBARs may be fabricated on piezoelectric plates with other crystallographic orientations.

The back surface 114 of the piezoelectric plate 110 is attached to a substrate 120 that provides mechanical support to the piezoelectric plate 110. The substrate 120 may be, for example, silicon, sapphire, quartz, or some other material. The substrate may have layers of silicon thermal oxide (TOX), SiO2, Diamond, SiOC, Si3N4, Tungsten (W) and crystalline silicon. The back surface 114 of the piezoelectric plate 110 or a diaphragm 115 including the plate may be bonded to the substrate 120 using a wafer bonding process, or grown on the substrate 120, or attached to the substrate in some other manner. The piezoelectric plate may be attached directly to the substrate or may be attached to the substrate via one or more intermediate material layers.

The conductor pattern of the XBAR 100 includes an interdigital transducer (IDT) 130. The IDT 130 includes a first plurality of parallel fingers, such as finger 136, extending from a first busbar 132 and a second plurality of fingers extending from a second busbar 134. The first and second pluralities of parallel fingers are interleaved. The interleaved fingers overlap for a distance AP, commonly referred to as the "aperture" of the IDT. The center-to-center distance L between the outermost fingers of the IDT 130 is the "length" of the IDT.

The first and second busbars 132, 134 serve as the terminals of the XBAR 100. A radio frequency or microwave signal applied between the two busbars 132, 134 of the IDT 130 excites a primary acoustic mode within the piezoelectric plate 110. As will be discussed in further detail, the excited primary acoustic mode is a bulk shear mode where acoustic energy propagates along a direction substantially orthogonal to the surface of the piezoelectric plate 110, which is also normal, or transverse, to the direction of the electric field created by the IDT fingers. Thus, the XBAR is considered a transversely-excited film bulk wave resonator.

A cavity 140 is formed in the substrate 120 such that a portion 115 of the piezoelectric plate 110 containing the IDT 130 is suspended over the cavity 140 without contacting the substrate 120. SMR pedestals 158 that are part of an acoustic Bragg reflector 154 formed in the cavity 140 are attached to the diaphragm 115 at locations under where the first and second plurality of parallel fingers 136 are disposed, to support plate 110.

"Cavity" has its conventional meaning of "an empty space within a solid body." The cavity 140 may be a hole completely through the substrate 120 (as shown in Section A-A and Section B-B) or a recess in the substrate 120 (as shown subsequently in FIG. 3A). The cavity 140 may be formed, for example, by selective etching of the substrate 120 before or after the piezoelectric plate 110 and the substrate 120 are attached. The Bragg reflector 154 and SMR 165 pedestals may be formed before or after forming the cavity 140.

In some cases, the Bragg reflector 154 and SMR pedestals 158 may be formed by forming layers of the Bragg reflector on a second substrate 121 and then attaching the second substrate to the bottom of substrate 120 such that the reflector and pedestals stick up through the bottom of the cavity 140 such as shown in section A-A. The layers of the Bragg reflector may be formed by blanket layering the reflector layers across a top surface of the second substrate 121, masking over the pedestal locations; and performing one or more selective etches to remove one or more top layers of the Bragg reflector between the pedestals. In another case, an etch stop layer may be deposited below a number of top layers of the reflector to select where a pedestal portion 156 having pedestals 158 will end and a mirror portion 155 having layers of the reflector across the cavity will begin. Then, the top layers of the reflector are etched to the etch stop to form the pedestals.

In other cases, instead of etching, a lift-off process may be used to remove the layers between the pedestals. For example, the layers of the mirror portion 155 may be deposited in sequence. A lift-off photoresist mask may be formed at the top of mirror portion 155 and between the pedestal locations. The top layers of the Bragg reflector may then be deposited. Removing the photoresist mask lifts off the top layers of the Bragg reflector between the pedestals to form pedestal portion 156.

Areas of the Bragg reflector that extend laterally beyond the cavity perimeter 145 and that are not going to extend vertically into cavity 140 can be etched away before, during or after forming the pedestals. Attaching the two substrates will be done so that the SMR pedestals 158 are attached to the bottom surface of diaphragm 115 or back surface 114 at locations under where the fingers 136 are disposed.

As shown in FIG. 1, the cavity 140 has a rectangular shape with an extent greater than the aperture AP and length L of the IDT 130. A cavity of an XBAR may have a different shape, such as a regular or irregular polygon. The cavity of an XBAR may more or fewer than four sides, which may be straight or curved.

The portion 115 of the piezoelectric plate suspended over the cavity 140 will be referred to herein as the "diaphragm" 115 (for lack of a better term) due to its physical resemblance to the diaphragm of a microphone. The diaphragm 115 may be continuously and seamlessly connected to the rest of the piezoelectric plate 110 around all, or nearly all, of perimeter 145 of the cavity 140. In this context, "contiguous" means "continuously connected without any intervening item". The IDT 130 is positioned on the piezoelectric plate 110 such that at least the fingers 136 of the IDT 130 are disposed on the diaphragm 115 of the piezoelectric plate that spans, or is suspended over, the cavity 140.

For ease of presentation in FIG. 1, the geometric pitch and width of the IDT fingers is greatly exaggerated with respect to the length (dimension L) and aperture (dimension AP) of the XBAR. A typical XBAR has more than ten parallel fingers in the IDT 110. An XBAR may have hundreds, possibly thousands, of parallel fingers in the IDT 110. Similarly, the thickness of the fingers in the cross-sectional views is greatly exaggerated.

Figure 2:
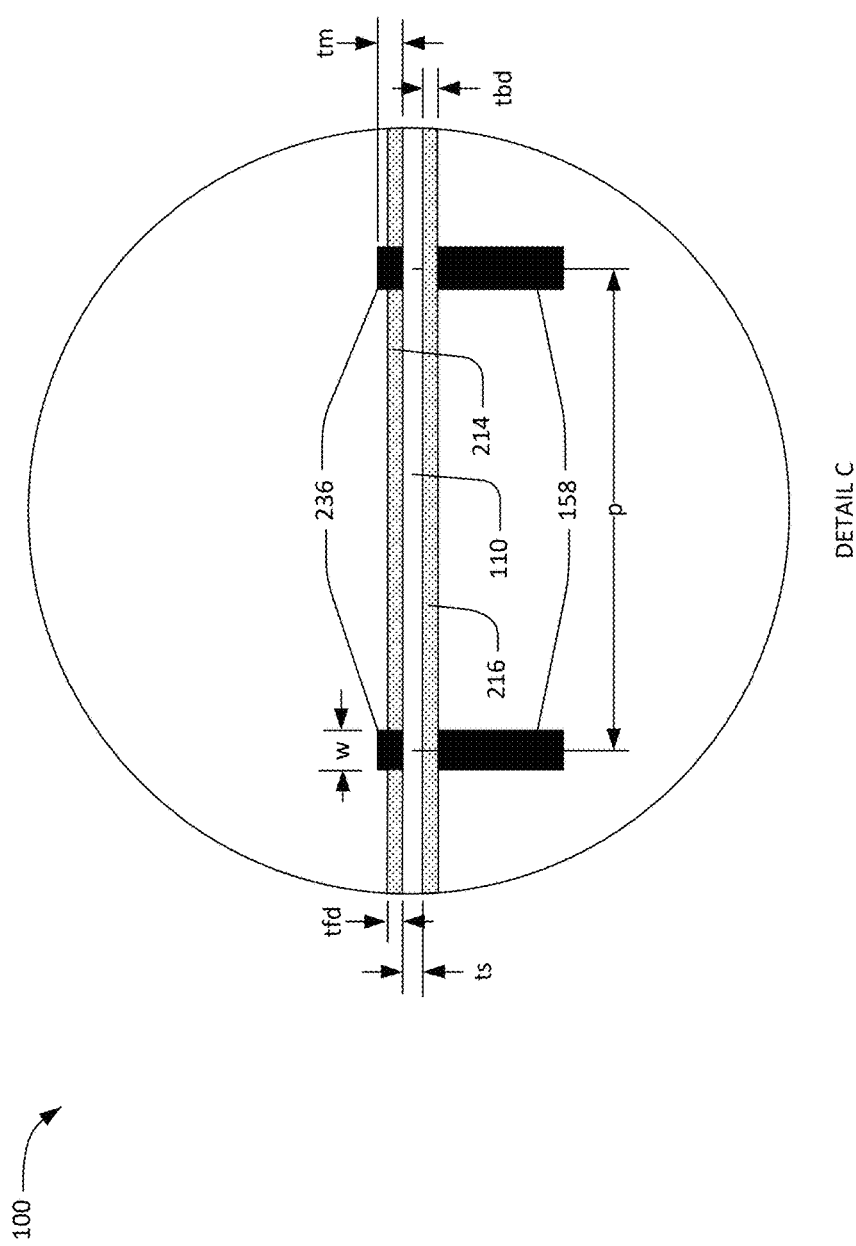
FIG. 2 is an expanded schematic cross-sectional view of a portion of the XBAR of FIG. 1.

FIG. 2 shows a detailed schematic cross-sectional view of the XBAR 100 of FIG. 1. The cross-sectional view may be a portion of the XBAR 100 that includes fingers of the IDT. The piezoelectric plate 110 is a single-crystal layer of piezoelectrical material having a thickness ts. ts may be, for example, 100 nm to 1500 nm. When used in filters for LTE™ bands from 3.4 GHZ to 6 GHz (e.g. bands n77, n79), the thickness ts may be, for example, 200 nm to 1000 nm.

A front-side dielectric layer 214 may optionally be formed on the front side of the piezoelectric plate 110. The "front side" of the XBAR is, by definition, the surface facing away from the substrate. The front-side dielectric layer 214 has a thickness tfd. The front-side dielectric layer 214 is formed between the IDT fingers 236. Although not shown in FIG. 2, the front side dielectric layer 214 may also be deposited over the IDT fingers 236. A back-side dielectric layer 216 may optionally be formed on the back side of the piezoelectric plate 110. The back-side dielectric layer 216 has a thickness tbd. The front-side and back-side dielectric layers 214, 216 may be a non-piezoelectric dielectric material, such as silicon dioxide or silicon nitride. tfd and tbd may be, for example, 0 to 500 nm. tfd and tbd are typically less than the thickness ts of the piezoelectric plate. tfd and tbd are not necessarily equal, and the front-side and back-side dielectric layers 214, 216 are not necessarily the same material. Either or both of the front-side and back-side dielectric layers 214, 216 may be formed of multiple layers of two or more materials.

SMR pedestals 158 of a Bragg reflector may be attached to plate 110 or back-side dielectric layer 216 (when it exists) at locations under where fingers 236 are disposed, such as to support diaphragm 115 over cavity 140.

The front side dielectric layer 214 may be formed over the IDTs of some (e.g., selected ones) of the XBAR devices in a filter. The front side dielectric 214 may be formed between and cover the IDT finger of some XBAR devices but not be formed on other XBAR devices. For example, a front side frequency-setting dielectric layer may be formed over the IDTs of shunt resonators to lower the resonance frequencies of the shunt resonators with respect to the resonance frequencies of series resonators, which have thinner or no front side dielectric. Some filters may include two or more different thicknesses of front side dielectric over various resonators. The resonance frequency of the resonators can be set thus "tuning" the resonator, at least in part, by selecting a thicknesses of the front side dielectric layer.

Further, a passivation layer may be formed over the total surface of the XBAR device 100 except for contact pads where electric connections are made to circuitry external to the XBAR device. The passivation layer is a thin dielectric layer intended to seal and protect the surfaces of the XBAR device while the XBAR device is incorporated into a package. The front side dielectric layer and/or the passivation layer may be, $SiO_2$, $Si_3N_4$, $Al_2O_3$, some other dielectric material, or a combination of these materials.

The thickness of the passivation layer may be selected to protect the piezoelectric plate and the metal electrodes from water and chemical corrosion, particularly for power durability purposes. It may range from 10 to 100 nm. The passivation material may consist of one or more oxide and/or nitride coatings such as SiO2 and Si3N4 material.

The IDT fingers 236 may be one or more layers of aluminum or a substantially aluminum alloy, copper or a substantially copper alloy, beryllium, tungsten, molybdenum, gold, or some other conductive material. Thin (relative to the total thickness of the conductors) layers of other metals, such as chromium or titanium, may be formed under and/or over the fingers to improve adhesion between the fingers and the piezoelectric plate 110 and/or to passivate or encapsulate the fingers. The busbars (132, 134 in FIG. 1) of the IDT may be made of the same or different materials as the fingers.

Dimension p is the center-to-center spacing or "pitch" of the IDT fingers, which may be referred to as the pitch of the IDT and/or the pitch of the XBAR. Dimension w is the width or "mark" of the IDT fingers. The IDT of an XBAR differs substantially from the IDTs used in surface acoustic wave (SAW) resonators. In a SAW resonator, the pitch of the IDT is one-half of the acoustic wavelength at the resonance frequency. Additionally, the mark-to-pitch ratio of a SAW resonator IDT is typically close to 0.5 (i.e. the mark or finger width is about one-fourth of the acoustic wavelength at resonance). In an XBAR, the pitch p of the IDT is typically 2 to 20 times the width w of the fingers. In addition, the pitch p of the IDT is typically 2 to 20 times the thickness is of the piezoelectric slab 212. The width of the IDT fingers in an XBAR is not constrained to one-fourth of the acoustic wavelength at resonance. For example, the width w of XBAR IDT fingers may be 500 nm or greater, such that the IDT can be fabricated using optical lithography. The thickness tm of the IDT fingers may be from 100 nm to about equal to the width w. The thickness of the busbars (132, 134 in FIG. 1) of the IDT may be the same as, or greater than, the thickness tm of the IDT fingers.

Figure 3A:
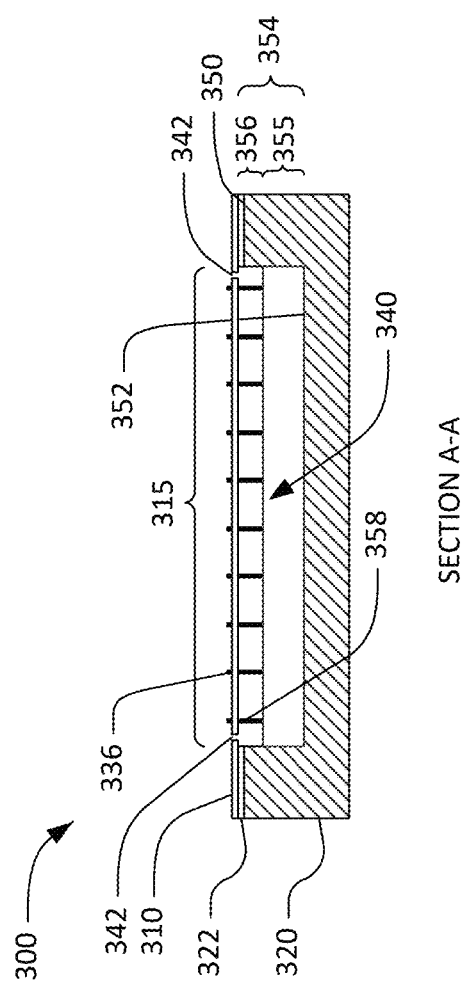
FIG. 3A is an alternative schematic cross-sectional view of the XBAR of FIG. 1.

FIG. 3A is an alternative cross-sectional view of XBAR device 300 along the section plane A-A defined in FIG. 1. In FIG. 3A, a piezoelectric plate 310 is attached to a substrate 320. A portion of the piezoelectric plate 310 forms a diaphragm 315 spanning a cavity 340 in the substrate. The cavity 340, does not fully penetrate the substrate 320, and is formed in the substrate under the portion of the piezoelectric plate 310 containing the IDT of an XBAR. Fingers, such as finger 336, of an IDT are disposed on the diaphragm 315.

Thus, substrate 320 has a substrate top surface 350 and a cavity bottom surface 352 below that forms the bottom of cavity 340. Acoustic Bragg reflector 354 is sandwiched between the substrate cavity bottom surface 352 and a back surface of the piezoelectric diaphragm 315. The acoustic Bragg reflector is configured to reflect shear acoustic waves at a resonance frequency of the acoustic resonator device 300. Two or more layers of the acoustic Bragg reflector form SMR pedestals 358 that support the back surface of the piezoelectric diaphragm 315 opposite some or all interleaved fingers 336 of the IDT. For example, the SMR pedestals may be part of reflector 354 that is attached to diaphragm 315 at locations under where the fingers 336 are disposed on diaphragm 315.

The cavity 340 may be formed, for example, by etching the substrate 320 before attaching the piezoelectric plate 310. This type of cavity 340 may be a swimming pool cavity that does not extend to the bottom surface of the substrate. This type of cavity may be formed by masking and etching selected areas of the front surface of the substrate 320 to form both shunt and series cavities. It may also or independently involve selectively etching a sacrificial layer of material deposited in the cavity area locations and depths to form both shunt and series cavities.

The Bragg reflector 354 and SMR pedestals 358 may be formed after forming cavity 340; and before piezoelectric plate 110 and the substrate 120 are attached. The layers of the Bragg reflector may be formed by forming layers of the Bragg reflector on the substrate cavity bottom surface 352 in the cavity, masking over the pedestal locations, and performing one or more selective etches of the layers of pedestal portion 356 of the Bragg reflector with respect to the mask to remove one or more top layers of the Bragg reflector pedestal portion 356 between the pedestals 358. In another case, an etch stop layer may be deposited below a number of top layers of the reflector to select where a pedestal portion 356 having pedestals 358 will end and a mirror portion 355 having layers of the reflector across the cavity 340 will begin. Then, the top layers of the reflector are etched to the etch stop to form the pedestals.

In other cases, instead of etching, a lift-off process may be used to remove the layers between the pedestals 336. For example, the layers of the mirror portion 355 may be deposited in sequence. A lift-off photoresist mask may be formed at the top of mirror portion 355 and between the pedestal locations. The top layers of the Bragg reflector may then be deposited. Removing the photoresist mask lifts off the top layers of the Bragg reflector between the pedestals to form pedestal portion 356.

The plate 310 or diaphragm 315 may then be attached to or mounted onto substrate 320 so that the back surface of the piezoelectric diaphragm 315 is attached to or bonded to the top surfaces of the SMR pedestals 358, and the top surfaces of the SMR pedestals 358 are opposite some or all interleaved fingers 336 of the IDT.

In some cases, air gaps between the pedestals 358 of pedestal portion 356 may be filled with a sacrificial layer or material before bonding the plate to the substrate. The sacrificial layer may be Kapton, or phosphosilicate glass (PSG) material to be etched away at the end of processing through via hole openings 342 at the sides of the XBAR diaphragm 315.

The diaphragm 315 may be contiguous with the rest of the piezoelectric plate 310 around a large portion of a perimeter 345 of the cavity 340. For example, the diaphragm 315 may be contiguous with the rest of the piezoelectric plate 310 around at least 50% of the perimeter of the cavity 340.

One or more intermediate material layers 322 may be attached between plate 310 and substrate 320. An intermediary layer may be an etch stop layer, a sealing layer, an adhesive layer or layer of other material that is attached or bonded to plate 310 and substrate 320. In other embodiments, the piezoelectric plate 310 is attached directly to the substrate 320 and an intermediary layer does not exist.

In some cases, plate 310 is a single-crystal piezoelectric plate, a z-axis of the plate 310 is normal to the front and back surfaces of the plate, the IDT is oriented such that the fingers 336 of the IDT are parallel to an x-axis of the plate 310, and the plate 310 is one of lithium niobate and lithium tantalate.

While the cavity 340 is shown in cross-section, it should be understood that the lateral extent of the cavity is a continuous closed band area of substrate 320 that surrounds and defines the size of the cavity 340 in the direction normal to the plane of the drawing. The lateral (i.e. left-right as shown in the figure) extent of the cavity 340 is defined by the lateral edges substrate 320. The vertical (i.e. down from plate 310 as shown in the figure) extent or depth of the cavity 340 into substrate 320. In this case, the cavity 340 has a side cross-section rectangular, or nearly rectangular, cross section.

The XBAR 300 shown in FIG. 3A will be referred to herein as a "front-side etch" configuration since the cavity 340 is etched from the front side of the substrate 320 before attaching the piezoelectric plate 310. The XBAR 100 of FIG. 1 will be referred to herein as a "back-side etch" configuration since the cavity 140 is etched from the back side of the substrate 120 before or after attaching the piezoelectric plate 110. In the case of the back-side etch configuration, the Bragg reflector and SMR pedestals may be formed as noted for FIG. 1.

Figure 3B:
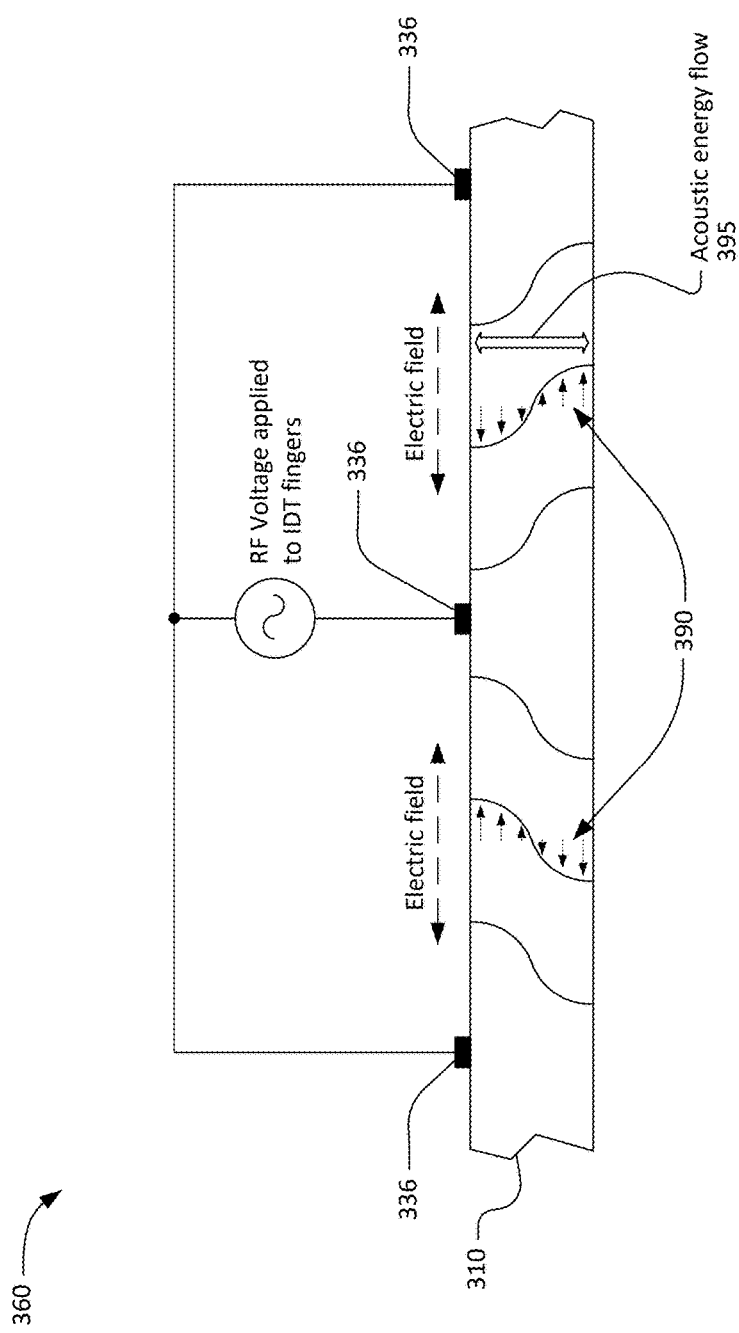
FIG. 3B is a graphical illustration of the primary acoustic mode of interest in an XBAR.

FIG. 3B is a graphical illustration of the primary acoustic mode of interest in an XBAR. FIG. 3B shows a small portion of an XBAR 360 including a piezoelectric plate 310 and three interleaved IDT fingers 336. XBAR 360 may be part of any XBAR herein. An RF voltage is applied to the interleaved fingers 336. This voltage creates a time-varying electric field between the fingers. The direction of the electric field is primarily lateral, or parallel to the surface of the piezoelectric plate 310, as indicated by the arrows labeled "electric field". Due to the high dielectric constant of the piezoelectric plate, the electric field is highly concentrated in the plate relative to the air. The lateral electric field introduces shear deformation, and thus strongly excites a primary shear-mode acoustic mode, in the piezoelectric plate 310. In this context, "shear deformation" is defined as deformation in which parallel planes in a material remain parallel and maintain a constant distance while translating relative to each other. A "shear acoustic mode" is defined as an acoustic vibration mode in a medium that results in shear deformation of the medium. The shear deformations in the XBAR 360 are represented by the curves 390, with the adjacent small arrows providing a schematic indication of the direction and magnitude of atomic motion. The degree of atomic motion, as well as the thickness of the piezoelectric plate 310, have been greatly exaggerated for ease of visualization. While the atomic motions are predominantly lateral (i.e. horizontal as shown in FIG. 3B), the direction of acoustic energy flow of the excited primary shear acoustic mode is substantially orthogonal to the front and back surface of the piezoelectric plate, as indicated by the arrow 395.

An acoustic resonator based on shear acoustic wave resonances can achieve better performance than current state-of-the art film-bulk-acoustic-resonators (FBAR) and solidly-mounted-resonator bulk-acoustic-wave (SMR BAW) devices where the electric field is applied in the thickness direction. In such devices, the acoustic mode is compressive with atomic motions and the direction of acoustic energy flow in the thickness direction. In addition, the piezoelectric coupling for shear wave XBAR resonances can be high (>20%) compared to other acoustic resonators. High piezoelectric coupling enables the design and implementation of microwave and millimeter-wave filters with appreciable bandwidth.

SMR pedestals of a Bragg reflector (not shown in FIG. 3B) may be attached to plate 110 or a back-side dielectric layer under the plate (when it exists) at locations under where fingers 336 are disposed, such as to support the plate 110 over a cavity. The acoustic Bragg reflector is configured to reflect shear acoustic waves, such as the acoustic energy flow of the excited primary shear acoustic mode as indicated by the arrow 395, at a resonance frequency of the XBAR resonator 360. The SMR pedestals are also configured to reflect shear acoustic waves at a resonance frequency of the XBAR resonator 360.

Figure 4A:
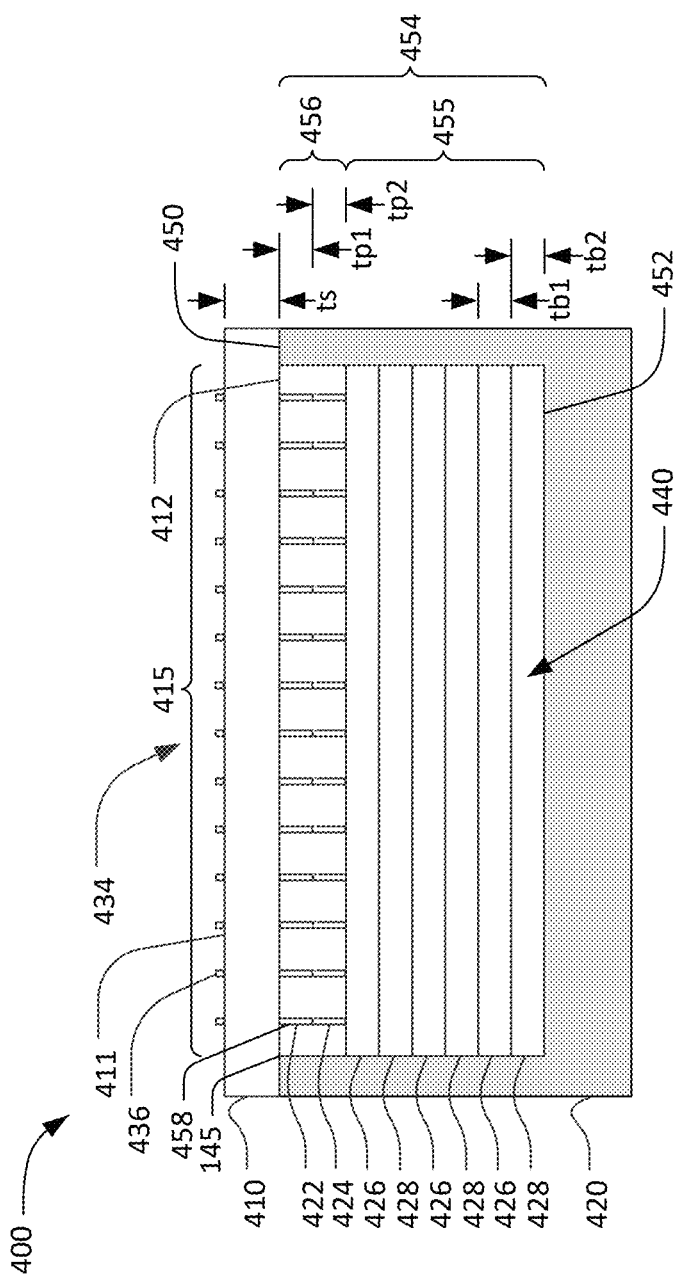
FIG. 4A is a schematic cross-sectional view of an improved XBAR with solidly mounted resonator (SMR) pedestals.

FIG. 4A is a schematic cross-sectional view of an improved XBAR resonator 400 with solidly mounted resonator (SMR) pedestals. Resonator 400 may be or may be part of a lower frequency shunt resonator or a higher frequency series resonator. In any case, resonator 400 can be any of the resonators described herein.

Resonator 400 has substrate 420 having a cavity 440. Substrate 420 has substrate top surface 450 at and beyond perimeter 145 and cavity 440 has cavity top surface 452. A piezoelectric plate 410 (e.g., part of diaphragm 415) spans the cavity 440. Plate 410 has a plate front surface 411 and plate back surface 412 that is mounted on the substrate top surface 450 at the perimeter of cavity 440. The front and back surfaces of plate 410 may be a planarized (e.g., CMP or polished). A portion of the piezoelectric plate 410 that is not attached to substrate 420 forms diaphragm 415 that spans the cavity 440. The diaphragm 415 has a desired thickness for shunt or series resonators. In some cases, the thickness has a frontside dielectric (not shown) to form a shunt resonator. Interdigital transducer (IDT) 434 formed on a front surface 411 of the piezoelectric plate 410 such that interleaved fingers 436 of the IDT are disposed on the diaphragm 415. The cavity 440 may be a swimming pool cavity. It may be neither back etched nor front etched through the plate.

Acoustic Bragg reflector 454 is sandwiched between the substrate 420 and a back surface 412 of the piezoelectric plate 410. In some cases, reflector 454 is sandwiched between the substrate cavity bottom surface 452 and a back surface of the diaphragm 415 which may have a back-side dielectric and/or bonding layer. Two or more layers of the acoustic Bragg reflector 454 form SMR pedestals 458 that support the back surface 412 of the piezoelectric plate opposite some or all interleaved fingers 136. In some cases, the pedestals support every finger. In other cases, the pedestals support and are aligned with every n fingers of the IDT, where n is an integer greater than or equal to two and less than or equal to twenty. The pedestals may be periodically placed or placed in a pattern such as two, a space, then two more. Being aligned with may mean that the pedestals are centered under and extend along some or all of the length of each the fingers.

The term "sandwiched" means the acoustic Bragg reflector 454 is both disposed between and physically connected to a surface 452 of the substrate 220 and the back surface 412 of the piezoelectric plate 410. The acoustic Bragg reflector 454 includes multiple layers that alternate between materials having high acoustic impedance and materials have low acoustic impedance, thus creating a high impedance ration between adjacent layers of the reflector. "High" and "low" are relative terms. For each layer, the standard for comparison is the adjacent layers. Each "high" acoustic impedance layer has an acoustic impedance higher than that of both the adjacent low acoustic impedance layers. Each "low" acoustic impedance layer has an acoustic impedance lower than that of both the adjacent high acoustic impedance layers. Each of the layers has a thickness equal to, or about, one-fourth of the acoustic wavelength at or near a resonance frequency of the XBAR 400. Materials having comparatively low acoustic impedance include silicon dioxide, silicon oxycarbide, aluminum, and certain plastics such as cross-linked polyphenylene polymers. Materials having comparatively high acoustic impedance include silicon nitride, aluminum nitride, silicon carbide, and metals such as molybdenum, tungsten, gold, and platinum. All of the high acoustic impedance layers of the acoustic Bragg reflector 454 are not necessarily the same material, and all of the low acoustic impedance layers are not necessarily the same material. In the example of FIG. 4A, the acoustic Bragg reflector 454 has a total of eight layers, a mirror portion 455 of the reflector has six of and a pedestals portion 456 has two of the total eight layers.

An acoustic Bragg reflector may have more than, or less than, eight layers. The mirror portion may have more than, or less than, six layers and the pedestals portion may have more than, or less than, two layers. In some cases, the reflector has between 8 and 200 layers. It may have 16, 24, 32, 40, 60 or 80 layers. The mirror portion may have ¾ of and pedestal portion may have ¼ of the reflector layers. In another case, the mirror portion has ½ of and pedestal portion has ½ of the reflector layers.

The acoustic Bragg reflector 454 is configured to reflect shear acoustic waves at a resonance frequency of the acoustic resonator device 400. Two layers 422 and 424 of the acoustic Bragg reflector form SMR pedestals 458 that support the back surface of the piezoelectric diaphragm 415 opposite all of the interleaved fingers 436 of the IDT. In other cases, the pedestals 458 only support some of interleaved fingers 436 of the IDT, such as every other finger or every third finger. Where they exist, the SMR pedestals 458 are part of reflector 454 that is attached to diaphragm 415 at locations under where the fingers 436 are disposed on diaphragm 415. The plate 410 has thickness ts. The layer 422 has thickness tp1 of silicon dioxide—SiO2, and layer 424 has thickness tp2 of Tungsten—W.

In some cases, all of the resonators on the same chip have the same Bragg reflector. For example, all of the resonators on substrate 120, 320 or 420 may have the same chip Bragg reflector layer materials and thickness as reflector 154, 354, 454, 484, 494 or 444, respectively. In some cases, shunt and series resonators may be on different chips, in which case the Bragg reflectors may be different, such as by having one or more different materials or thicknesses on the different chips. In some cases, shunt and series resonators may be on different chips, in which case the Bragg reflectors may be different.

One or more intermediate material layers (not shown) may be attached between SMR pedestals 458 and diaphragm 415. Here, an intermediary layer may be an etch stop layer, a sealing layer, a bonding layer, an adhesive layer or layer of other material that is attached or bonded to plate 310 and substrate 320. The intermediate layer may only exist where the SMR pedestals 458 are or may cover the total bottom surface of the diaphragm 415. The intermediate layer maybe a bonding layer and/or a back-side dielectric layer of the diaphragm 415.

Being opposite the fingers may mean that the pedestal is centered under a width of and extends along a length of the finger. Each pedestal 458 may exist opposite the total width and total length of the finger 436 it is opposite of. In some cases, each pedestal 458 has a width extending beyond the total width of the finger 436 it is opposite of by between 1 and 10 percent of the total width of the finger. Each pedestal 458 may extend from the busbar that the opposing finger is attached to, along most or all of the length of the finger. In some cases, each pedestal 458 has a length extending only along a middle portion of a length of the finger it is opposed to, such as by between 5 and 20 percent of the total length of that finger. In some cases, each pedestal 458 has a length extending only along an end portion of the length of the finger it is opposed to, such as by between 5 and 20 percent of the total length of that finger.

Each pedestal 458 may also exist opposite the busbar attached to the finger the pedestal is opposite to. In some case, each pedestal 458 may also exist opposite the gap between the end of the finger it is opposite to and the adjacent busbar that it is not attached to. It may or may not touch the pedestal 458 of the adjacent busbar.

The plate 410 has thickness ts, one layer 422 of pedestal 458 has thickness tp1 of silicon dioxide—SiO2, and layer 424 of pedestal 458 has thickness tp2 of Tungsten—W. The acoustic Bragg reflector 454 also has three pair of layers 426 of SiO2 and 428 of W under the SMR pedestals 458. Each layer 426 and 428 may exist across the top view area of the cavity and to the perimeter of the cavity.

The topmost layer of these pairs of layers is attached to layer 424 and the bottommost layer of these pairs is attached to surface 452 of substrate 420. One or more intermediate material layers (not shown) may be attached between the bottommost layer of these pairs of layers and surface 452 of substrate 420, such as noted for intermediate material layers attached between SMR pedestals 458 and diaphragm 415. For example, a layer of SiO2 may between the lowest layer of tungsten of the reflector 454 and substrate 420.

Each of layer 426 has thickness tb1 of silicon dioxide—SiO2, and each of layer 428 has thickness tb2 of Tungsten—W. Thickness tb1 may be equal to thickness tp1, and thickness tb2 may be equal to thickness tp2. Tp1 may be between 150 and 230 nm and tp2 may be between 110 and 180 nm. Tb1 may be equal to tp1 and tb2 may be equal to tp2.

Pairs of layers 426 and 428 of the acoustic Bragg reflector 454 are configured to reflect shear acoustic waves at a resonance frequency of the XBAR resonator 400. Layers 422 and 424 of the SMR pedestals 458 are also configured to reflect shear acoustic waves at a resonance frequency of the XBAR resonator 400.

Example 1

In Example 1, tp1 and tb1 are 190 nm; and tp2 and tb2 are 145 nm. Here, fingers 436 are aluminum (Al) with thickness (e.g., tm) of 500 nm and the substrate 420 is a silicon (Si) base substrate. The mark-to-pitch is 0.3 for the fingers 436 and for the pedestals 458. The pitch of the fingers 436 is 3.9 um. Plate 410 may be 400 nm thick of Z-Y cut lithium niobate (LN) or 400 nm thick of 120 degree cut Y-X cut lithium niobate (LN). The 120 degree cut refers to the cut angle of the Y-X cut LN in degrees. The example may have electrical boundary conditions where each of the layers 424 and 428 has a floating electrical potential. In another case, each of the layers 428 has a floating electrical potential and each of layers 424 has a potential equal to that of the corresponding Al finger 436 that is opposite of the layer 424.

The W layer 424 in the pedestal has a floating potential when the metal layer 424 in the pedestal 458 is not electrically connected to any other electrode, such as by not being electrically connected to a busbar or IDT. The floating potential of layer 424 is formed through a capacitive coupling through the LN plate 410, the oxide layer 422 in pedestal 458 and the first oxide layer 426 in the continuous Bragg mirror portion 455. The bottom of this first SiO2 layer 426 has floating potential throughout the device. It may be a common or ground electrode for the two composite capacitances formed by neighboring electrodes.

Alternatively, the W layer 424 in the pedestal has a potential equal to that of the corresponding Al finger 436 when the metal layer 424 in the pedestal 458 is electrically connected to a corresponding top electrode, such as to a busbar or IDT. This connection can by a via through the LN/SiO2 plate and bonding layer outside the pedestal domain or perimeter 415 (e.g., outside the device active area) from the IDT to the layer 424. In practice every other or second electrode of a filter (e.g., filter 500) can be connected to one pad that can be via connected to corresponding metal layer(s) under the LN plate 41. This applies separately to odd and even strips. One can imagine a bottom IDT configuration (formed by the top metal layer 424 in the pedestal) with two feeding pads, each connected to the true (e.g., having opposing fingers) IDT pad or busbar of IDT 130 on top.

Figure 4B:
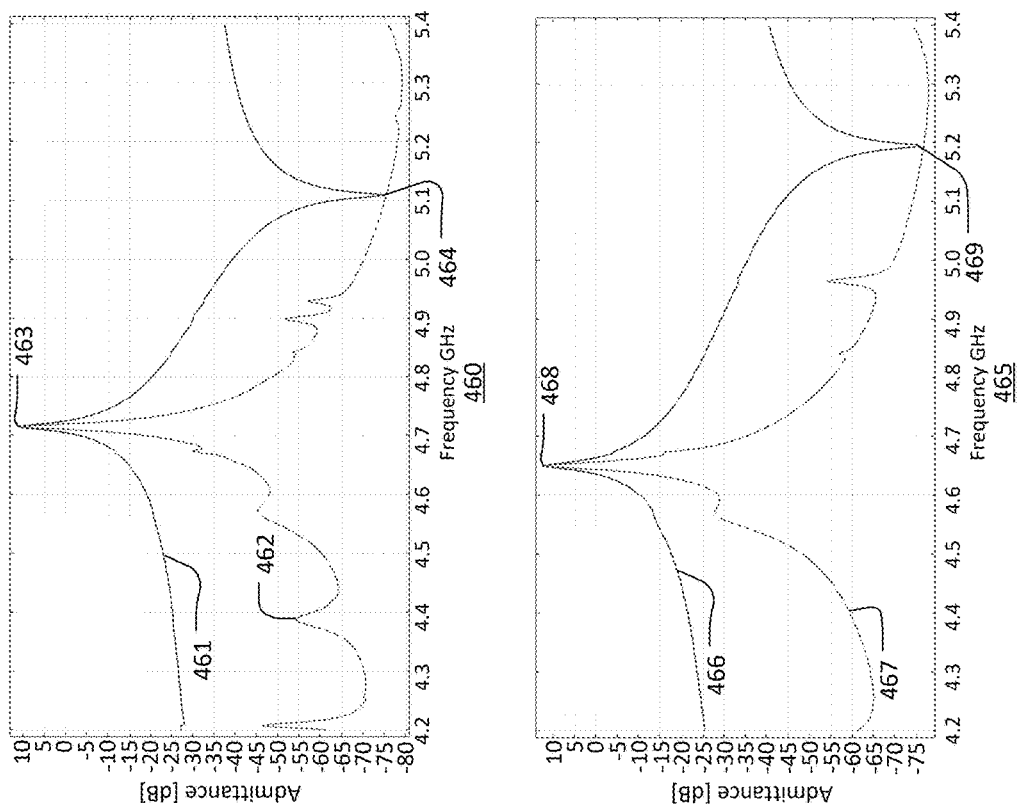
FIG. 4B is a graph that compares the magnitudes of the admittance and the conductance of XBARs with SMR pedestals and different plate thickness and cut.

FIG. 4B is graphs 460 and 465 that compare the normalized magnitudes of the admittance and the conductance (both on a logarithmic scale, such as decibel scale—dB) as a function of frequency for Example 1 of XBARs 400 of FIG. 4A that have different plate thickness and cuts. Admittance is a vector value that can be expressed as a magnitude and a phase. Conductance is the component of admittance that is in-phase with the applied signal. Conductance is a scalar value. The admittance and conductance data in the graphs 460, 465, 470 and 490 are results from three-dimensional finite element method (FEM) simulations of XBARs. Losses in the piezoelectric plate, acoustic Bragg reflector, pedestals and IDT fingers were simulated using standard material parameters.

Graph 460 shows a plot 461 of admittance in dB and a plot 462 of conductance for Example 1 having plate 410 that is a 400 nm thick of Z-Y cut lithium niobate (LN) plate. Graph 465 shows a plot 466 of admittance in dB and a plot 467 of conductance for Example 1 having plate 410 that is a 400 nm thick of 120 degree cut Y-X cut lithium niobate (LN) plate. In graphs 460 and 465, each of layers 424 and 428 has a floating electrical potential.

The admittance plot 461 for the simulated XBAR 400 exhibits a resonance 463 at a frequency FR of 4665 MHz and an anti-resonance 464 at a frequency FAR of 5110 MHz. Thus, the resonance to antiresonance (R-a-R) for plot 461 is 8.1 percent. The admittance plot 466 for the simulated XBAR 400 exhibits a resonance 468 at a frequency FR of 4650 MHz and an anti-resonance 469 at a frequency FAR of 5195 MHz. Thus, the resonance to antiresonance (R-a-R) for plot 466 is 11.1 percent.

The better performance of the graph 465 as compared to graph 460 is primarily due to greater electromechanical coupling of the 400 nm thick of 120 degree cut Y-X cut lithium niobate (LN) plate version of plate 410 as compared to that of the 400 nm thick of Z-Y cut lithium niobate (LN) plate version of plate 410 to the top of reflector 454. That is, the graph 465 shows higher electromechanical coupling (i.e. and thus a greater difference between resonance frequency 468 and anti-resonance frequency 469 than those of frequencies 463 and 464) because graph 465 is for a plate that has 120-degree Y-X cut LN instead of the Z-Y cut LN. The graph 460 is Z-Y cut LN which inherently has lower coupling. The lower electromechanical coupling of the 400 nm thick of Z-Y cut lithium niobate (LN) plate is due to less amount of electric energy in the IDT being transformed to acoustic energy in plate 410 via the piezoeffect for the Z-Y cut as compared to for the 120-degree Y-X cut LN plate. Once the acoustic part of the energy appears, its propagation may be defined by the elastic properties of the plate material. The acoustic emission of the two resonators may be fixed by the Bragg stack to be the same for both XBARs. Thus, the plate version for graph 465 may be more desirable than that for graph 460.

Figure 4C:
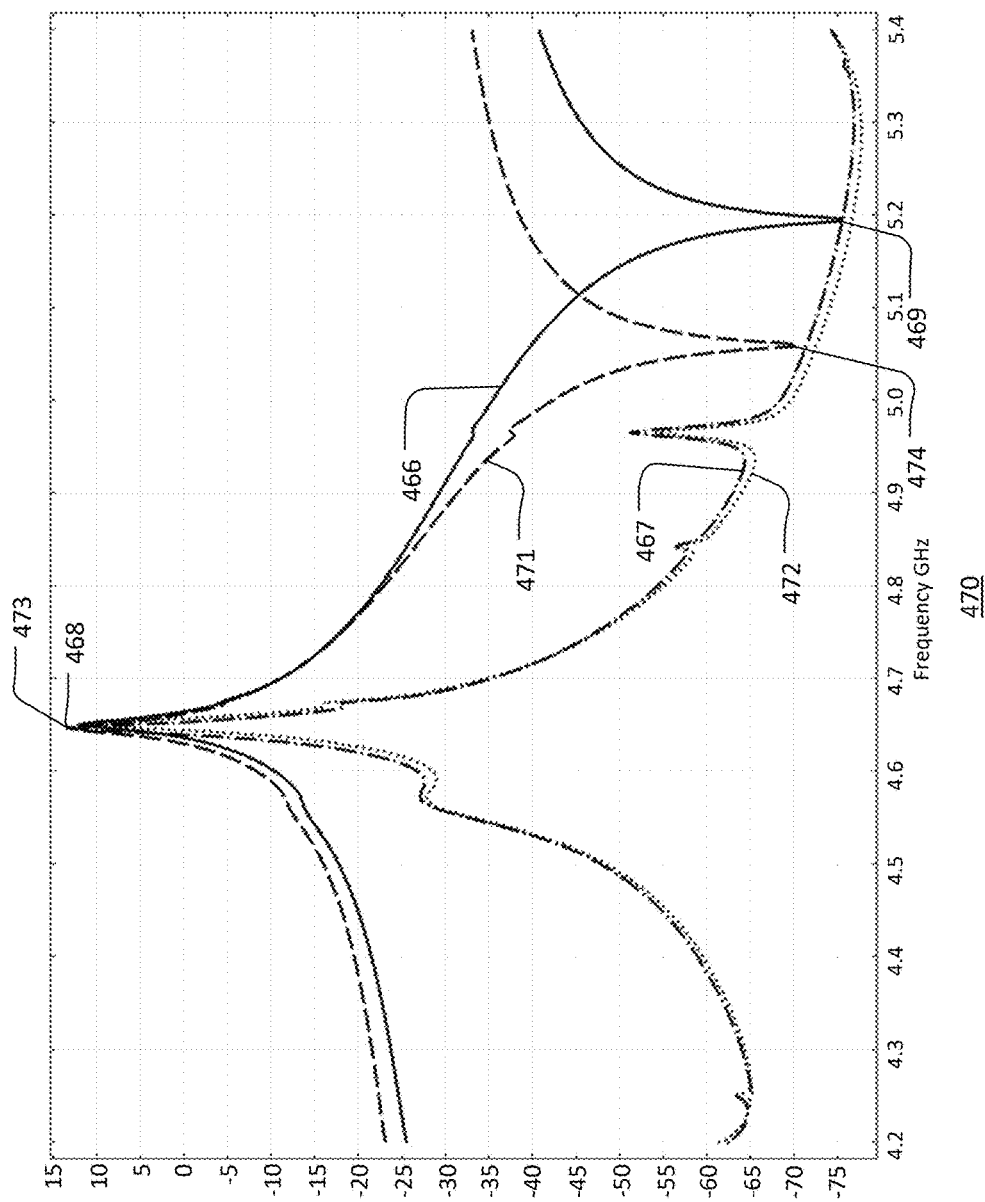
FIG. 4C is a graph that compares the magnitudes of the admittance and the conductance of XBARs with SMR pedestals that have different voltage biases in their pedestals.

FIG. 4C is graph 470 that compares the normalized magnitudes of the admittance and the conductance (both on a logarithmic scale) as a function of frequency for Example 1 of XBARs 400 of FIG. 4A that have different voltage biases in their pedestals. Graph 470 includes plots 466 and 467 of graph 465 where each of layers 424 and 428 has a floating electrical potential. Graph also includes admittance plot 471 and conductance plot 472 for Example 1 of XBARs 400 of FIG. 4A where each of layers 428 has a floating electrical potential but each of layers 424 has a biased electrical potential that is equal to that of the corresponding Al finger 436 that the layer 424 is opposite of. Similar to plots 466 and 467; plots 471 and 472 are for Example 1 having plate 410 that is a 400 nm thick of 120 degree cut Y-X cut lithium niobate (LN) plate.

For FIG. 4C, similar to FIG. 4B, the resonance to anti-resonance (R-a-R) for plot 466 is 11.1 percent for the floating potential layers. The admittance plot 471 for the simulated XBAR 400 with layers 424 has a biased electrical potential exhibits a resonance 473 at a frequency FR of 4650 MHz and an anti-resonance 474 at a frequency FAR of 5060 MHz. Thus, the resonance to antiresonance (R-a-R) for plot 471 is 8.5 percent.

The better performance (i.e. the higher R-a-R) of the plots 466 and 467 as compared to plots 471 and 472 is primarily due to greater electromechanical coupling of the floating potential W layers 424 and 428 version of reflector 454 to plate 410 than that of the XBAR 400 version with layers 424 having a biased electrical potential. One reason is that extra parasitic capacitance is formed between the pedestals having the biased electrical potential layers 424 through the underlying Bragg Stack of mirror portion 455. The extra parasitic capacitance adds a component to the electric energy in the system, while acoustic energy remains the same. Thus, the ratio between acoustic and electric energies in the system becomes smaller and therefore the coupling is smaller for plots 471 and 472. Thus, the devices and potential versions for plots 466 and 467 is more desirable than those for plots 471 and 472.

Figure 4D:
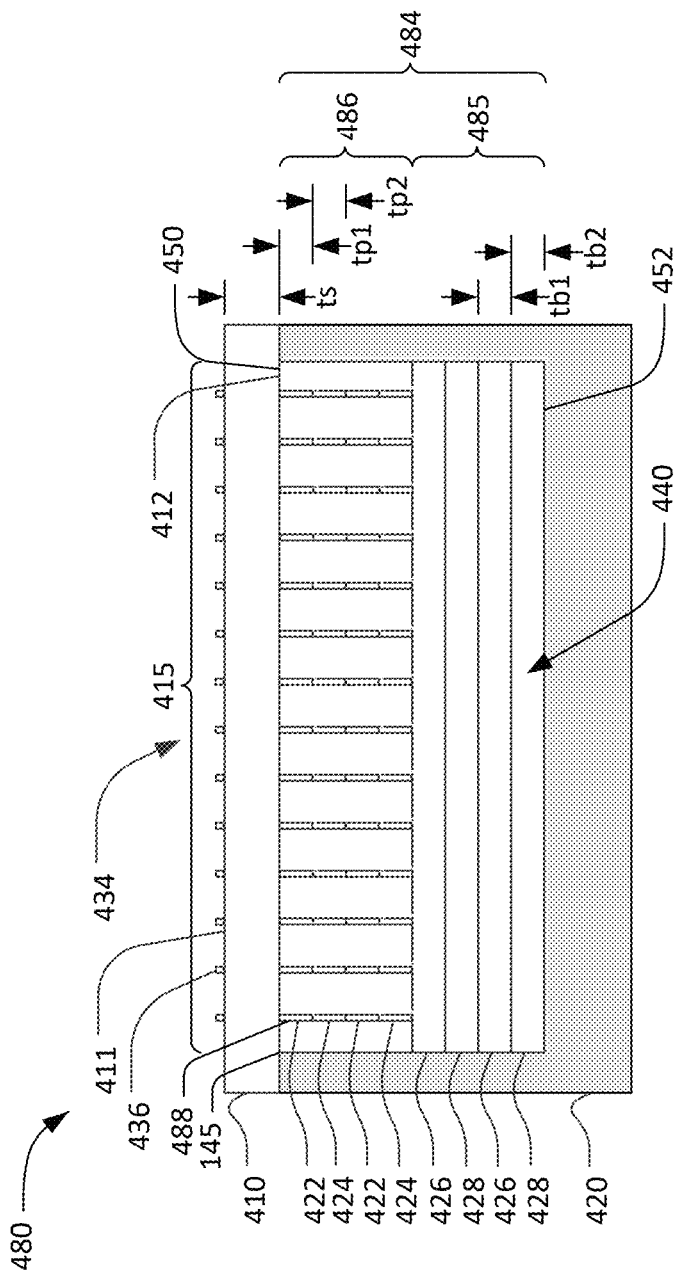
FIG. 4D is a schematic cross-sectional view of an improved XBAR with SMR pedestals that has a different number of layers its pedestals and mirrors than the XBAR of FIG. 4A.

FIG. 4D is a schematic cross-sectional view of improved XBAR resonator 480 with solidly mounted resonator (SMR) pedestals. Resonator 480 may be or may be part of a lower frequency shunt resonator or a higher frequency series resonator. In any case, resonator 480 can be any of the resonators described herein.

A difference between resonator 480 and 400 is that resonator 480 has an acoustic Bragg reflector 484 instead of reflector 454 sandwiched between the substrate 420 and a back surface 412 of the piezoelectric plate 410. Reflector 484 may be sandwiched between the substrate cavity bottom surface 452 and a back surface of the diaphragm 415 which may have a back-side dielectric and/or bonding layer. Four or more layers of the acoustic Bragg reflector 484 form SMR pedestals 488 that support the back surface 412 of the piezoelectric plate opposite some or all interleaved fingers 436. In some cases, the pedestals 488 are aligned with, support fingers of and/or are placed in a pattern as noted for pedestals 458 of reflector 454.

In the example of FIG. 4D, the reflector 484 has a total of eight layers, a mirror portion 485 of the reflector has four of and a pedestals portion 486 has four of the total eight layers. Reflector 484 may have more than, or less than eight layers. The mirror portion 485 may have more than, or less than four layers and the pedestals portion may have more than, or less than four layers. In some cases, the reflector a total number of layers as noted for reflector 454; the mirror portion has ½ of and pedestal portion has ½ of the reflector layers.

The acoustic Bragg reflector 484 is configured to reflect shear acoustic waves at a resonance frequency of the resonator 480. Four layers 422 and 424 of the reflector form SMR pedestals 488 that are attached to diaphragm 415 and support the back surface of the piezoelectric diaphragm 415 opposite all or some of the interleaved fingers 436 as noted for fingers 454. Being opposite the fingers may mean that the pedestal is centered under and/or extends along the length of the finger as noted for pedestals 454.

One or more intermediate material layers (not shown) may be attached between SMR pedestals 488 and diaphragm 415 as noted for reflector 454. The plate 410 has thickness ts. The layers 422, 424, 426 and 428 have thicknesses as note for reflector 454. The pedestals of reflector 484 may be opposite the fingers, busbars and opposing busbars of XBAR 480 as described reflector 454 and XBAR 400.

The plate 410 has thickness ts, two interleaved layers 422 have thickness tp1 of silicon dioxide—SiO2, and layers 424 have thickness tp2 of Tungsten—W as noted for reflector 454. The acoustic Bragg reflector 484 has two pair of layers 426 of SiO2 and 428 of W under the SMR pedestals 488. Each layer 426 and 428 may exist across the top view area of the cavity and to the perimeter of the cavity. The topmost layer of these pairs of layers is attached to bottommost layer 424 and the bottommost layer of these pairs is attached to surface 452 of substrate 420. One or more intermediate material layers may be attached between the bottommost layer of these pairs of layers and surface 452 of substrate 420 as noted for SMR pedestals 458 and diaphragm 415.

For reflector 484, each layer 426 has thickness tb1 of silicon dioxide—SiO2, and each of layer 428 has thickness tb2 of Tungsten—W as noted for layers 426 and 428 of reflector 454. Pairs of layers 426 and 428 and of layer 422 and 424 are configured to reflect shear acoustic waves at a resonance frequency of the XBAR resonator 480 as noted for these layers of reflector 454.

Example 2

Example 2 is Example 1 as applied to XBAR 480 instead of XAR 400; and uses plate 410 of 400 nm thick of 120 degree cut Y-X cut lithium niobate (LN).

Figure 4E:
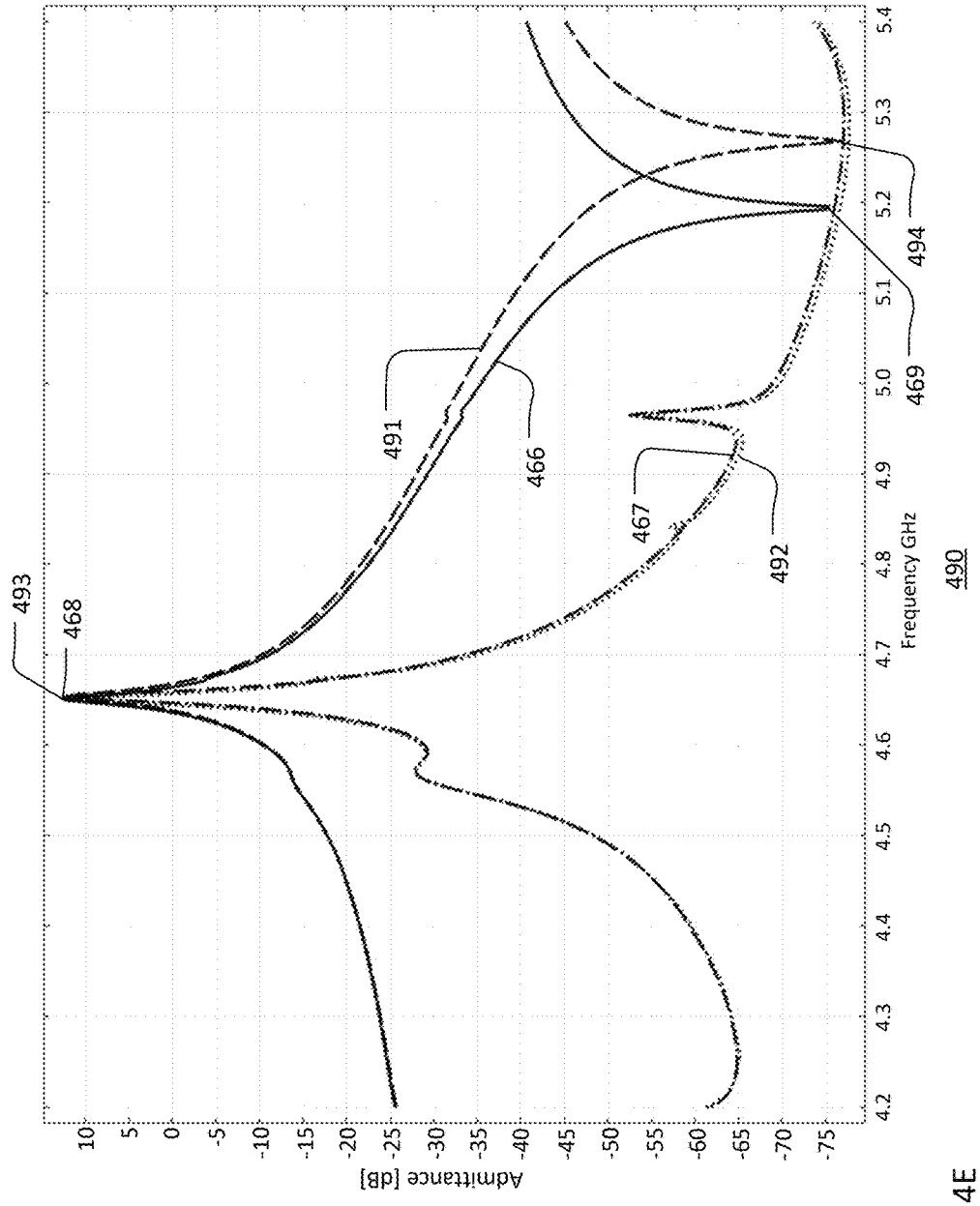
FIG. 4E is a graph that compares the magnitudes of the admittance and the conductance of XBARs with SMR pedestals that have different numbers of layers in their pedestals and mirrors.

FIG. 4E is graph 490 that compares the normalized magnitudes of the admittance and the conductance (both on a logarithmic scale) as a function of frequency for Examples 1 and 2 of XBARs 400 and 480, of FIGS. 4A and 4D respectively, where plate 410 is 120 degree Y-X cut lithium niobate (LN). In graph 490, each of layers 424 and 428 has a floating electrical potential. Graph 490 includes plots 466 and 467 of graph 465. Graph also includes admittance plot 491 and conductance plot 492 for Example 2 of XBARs 480 of FIG. 4D.

For FIG. 4E, similar to FIG. 4B, the resonance to anti-resonance (R-a-R) for plot 466 of the two layer pedestal is 11.1 percent. The admittance plot 491 for the simulated XBAR 480 of Example 2 exhibits a resonance 493 at a frequency FR of 4650 MHz and an anti-resonance 494 at a frequency FAR of 5270 MHz. Thus, the resonance to antiresonance (R-a-R) for plot 471 is 12.4 percent for the four layer pedestal.

The better performance of the plots 491 and 492 as compared to plots 466 and 467 is primarily due to greater electromechanical coupling of the floating potential W layers 424 and 428 version of reflector 484 to plate 410 than that of the XBAR 400 version with layers 424 and 428 of reflector 454. One reason is that extra parasitic capacitance is formed between the pedestals having only the two layers 422 and 424 in the pedestals 458 than the lower parasitic capacitance of reflector 484 which has four layers 422 and 424 in the pedestals 488 and thus has parasitic capacitance that is two times lower than that of reflector 454. The structure with 4 layers in pedestal has smaller parasitic capacitance than the structure with 2 layers since in the structure with 4 layers there are 2 capacitors connected in series; i.e., with effectively half capacitance to the one formed in 2 layer pedestal. Thus, the reduction in parasitic capacitance leads to overall decrease in electric energy in the system for the same acoustic energy—thus the coupling which is their ratio (mechanical/acoustic vs. electrical energy) becomes larger. Thus, the reflector 480 for graph 491 and 492 may be more desirable than reflector 400 for graph 466 and 467.

Figure 4F:
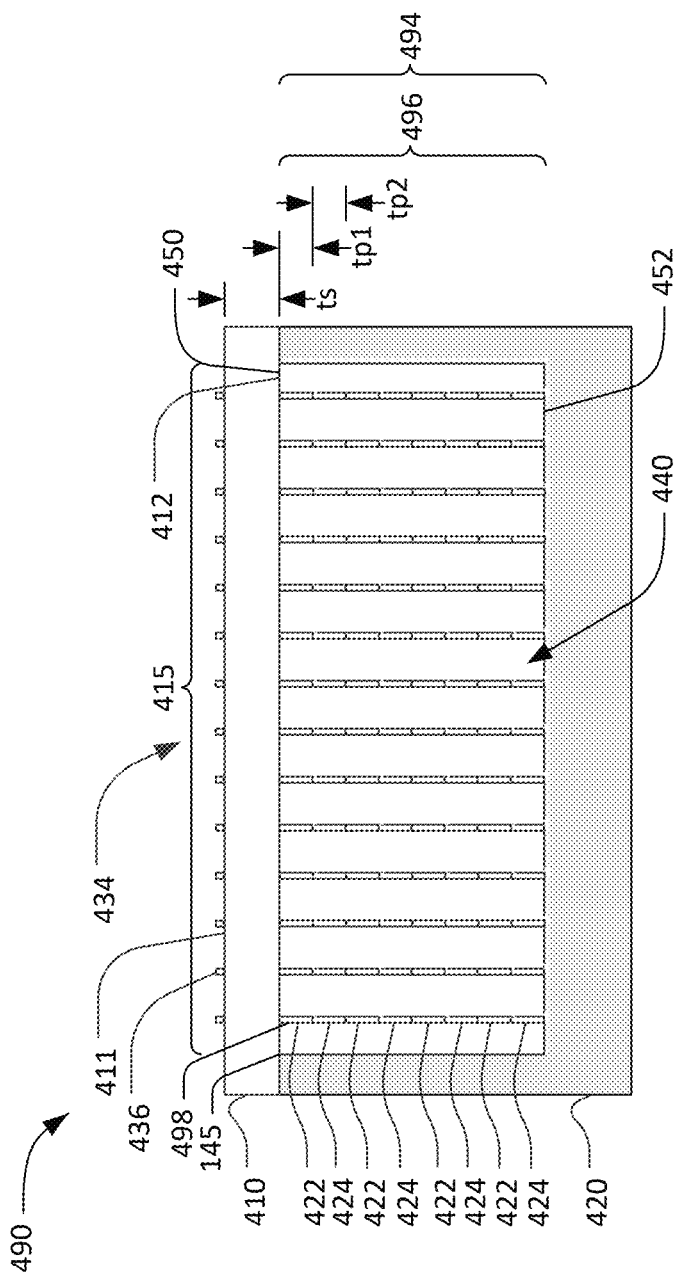
FIG. 4F is a schematic cross-sectional view of an improved XBAR with SMR pedestals that has a different number of layers its pedestals and mirrors than the XBAR of FIG. 4A.

FIG. 4F is a schematic cross-sectional view of improved XBAR resonator 490 with solidly mounted resonator (SMR) pedestals. Resonator 490 may be or may be part of a lower frequency shunt resonator or a higher frequency series resonator. In any case, resonator 490 can be any of the resonators described herein.

A difference between resonator 490 and 400 or 480 is that resonator 490 has an acoustic Bragg reflector 494 instead of reflector 454 or 484, respectively, sandwiched between the substrate 420 and a back surface 412 of the piezoelectric plate 410. Reflector 494 may be sandwiched between the substrate cavity bottom surface 452 and a back surface of the diaphragm 415 which may have a back-side dielectric and/or bonding layer. Eight or more layers of the acoustic Bragg reflector 494 form SMR pedestals 498 that support the back surface 412 of the piezoelectric plate opposite some or all interleaved fingers 436. In some cases, the pedestals 498 are aligned with, support fingers of and/or are placed in a pattern as noted for pedestals 458 of reflector 454.

In the example of FIG. 4F, the reflector 494 has a total of eight layers, has no mirror portion of the reflector, and has a pedestal section 496 having pedestals with the total eight layers. Reflector 494 and pedestal section 496 may have more than, or less than eight layers.

The acoustic Bragg reflector 494 is configured to reflect shear acoustic waves at a resonance frequency of the resonator 490. Eight layers 422 and 424 of the reflector form SMR pedestals 498 that are attached to diaphragm 415 and support the back surface of the piezoelectric diaphragm 415 opposite all or some of the interleaved fingers 436 as noted for fingers 454. Being opposite the fingers may mean that the pedestal is centered under and/or extends along the length of the finger as noted for pedestals 454.

One or more intermediate material layers (not shown) may be attached between SMR pedestals 498 and diaphragm 415 as noted for reflector 454. The plate 410 has thickness ts. The layers 422 and 424 have thicknesses as note for reflector 454. The pedestals of reflector 494 may be opposite the fingers, busbars and opposing busbars of XBAR 480 as described reflector 454 and XBAR 400.

The plate 410 has thickness ts, two interleaved layers 422 have thickness tp1 of silicon dioxide—SiO2, and layers 424 have thickness tp2 of Tungsten—W as noted for reflector 454. The bottommost layer of these pairs is attached to surface 452 of substrate 420. One or more intermediate material layers may be attached between the bottommost layer of these pairs of layers and surface 452 of substrate 420 as noted for SMR pedestals 458 and diaphragm 415.

Pairs of layers 422 and 424 are configured to reflect shear acoustic waves at a resonance frequency of the XBAR resonator 490 as noted for these layers of reflector 454.

Figure 4G:
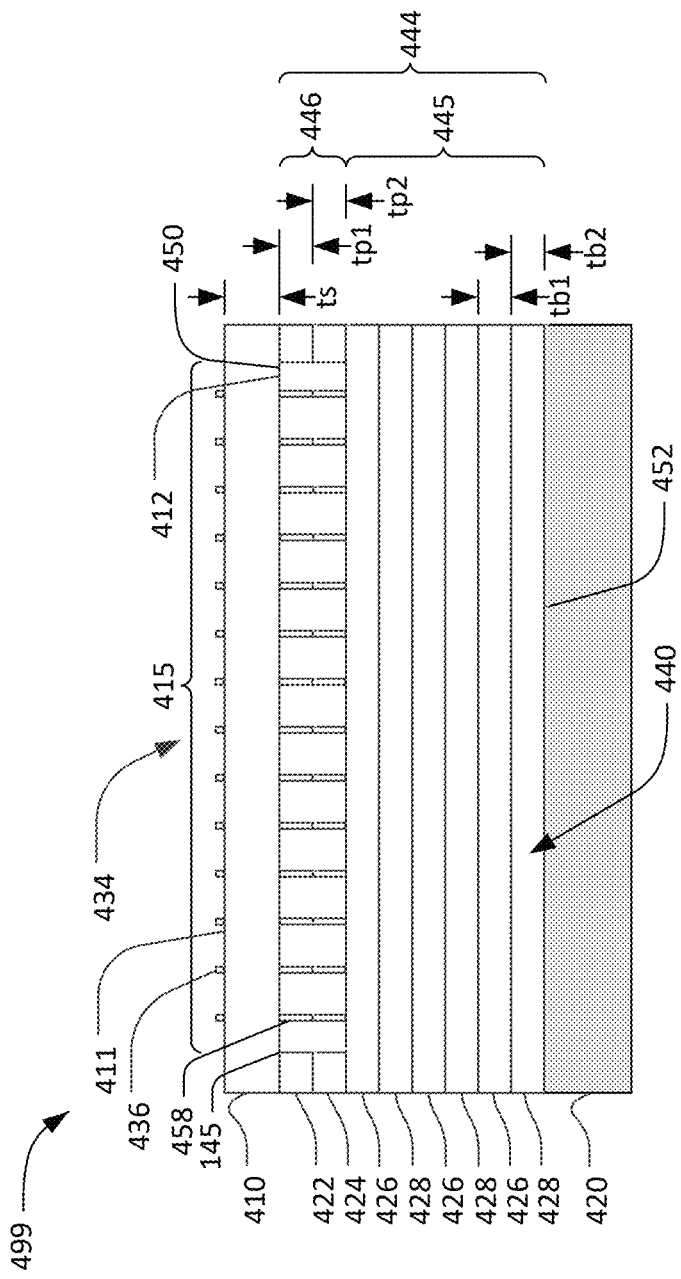
FIG. 4G is a schematic cross-sectional view of a improved XBAR with SMR pedestals that has Bragg reflector layers in the perimeter of its cavity.

FIG. 4G is a schematic cross-sectional view of improved XBAR resonator 499 with solidly mounted resonator (SMR) pedestals. Resonator 499 may be or may be part of a lower frequency shunt resonator or a higher frequency series resonator. In any case, resonator 499 can be any of the resonators described herein.

A difference between resonator 499 and 400 is that resonator 499 has an acoustic Bragg reflector 444 instead of reflector 454 sandwiched between the substrate 420 and a back surface 412 of the piezoelectric plate 410.

Reflector 444 may be similar to reflector 454, except that reflector 444 also has layers 422, 424, 426 and 428 sandwiched between the substrate cavity bottom surface 452 and a back surface of the diaphragm 415 around the perimeter 145 of cavity 440. Reflector 444 may have layers 422, 424, 426 and 428 extending in as blanket layers between substrate cavity bottom surface 452 and a back surface of the diaphragm 415, except for the pedestal portion 446 where layers 422 and 424 are removed to form the pedestals 458 and thus to also form cavity 440.

In the example of FIG. 4G, the reflector 444 has a total of eight layers, a mirror portion 445 of the reflector has two of and a pedestals portion 446 has six of the total eight layers. Reflector 444, mirror portion 445 and/or pedestal portion 446 may have more or less layers as noted for reflector 454.

The plate 410 or diaphragm 415 may be attached to or mounted onto the reflector 444 so that the back surface of the piezoelectric diaphragm 4158 is attached to or bonded to the top surfaces of the perimeter 145 and pedestals 458, and the top surfaces of the pedestals are opposite locations of some or all interleaved fingers.

The acoustic Bragg reflector 444 is configured to reflect shear acoustic waves at a resonance frequency of the resonator 499 similar to reflector 454 and resonator 400.

The layers of the Bragg reflector 444 may be formed by blanket layering the reflector layers across a top surface 452 of the substrate 420, masking over the pedestal locations, performing a first selective etch with respect to the mask to remove a top layer 422 of the Bragg reflector between the pedestals, and then performing a second selective etch with respect to the mask to remove a second top layer 424 of the Bragg reflector between the pedestals.

In another case, an etch stop layer may be deposited below a selected number of top layers, such as below layer 424 of the reflector to select where the pedestal portion 446 will end and mirror portion 445 of the reflector will begin. Then, the top two layers of the reflector are etched to the etch stop to form the pedestals.

In other cases, instead of etching, a lift-off process may be used to remove the layers between the pedestals 458. For example, the layers of the mirror portion 455 may be deposited in sequence. A lift-off photoresist mask may be formed at the top of mirror portion 455 and between the pedestal locations. The top layers 422 and 424 of the Bragg reflector may then be deposited. Removing the photoresist mask lifts off the top layers 422 and 424 of the Bragg reflector between the pedestals 458 to form pedestal portion 456.

The plate 410 or diaphragm 415 is then be attached to or mounted onto substrate 420 so that the back surface of the piezoelectric diaphragm 415 is attached to or bonded to the top surfaces of the SMR pedestals 458, and the top surfaces of the SMR pedestals 458 are opposite some or all interleaved fingers 436 of the IDT.

The concepts described above for resonator 499 can also be applied to resonators 300, 480 and 490. For example, resonator 300, 480 or 490 can have a version of a reflector 484 or 494, respectively, that also has layers 422, 424, 426 and 428 sandwiched between the substrate cavity bottom surface 452 and a back surface of the diaphragm 415 around the perimeter 145 of cavity 440, similar to reflector 444.

In other embodiments, of resonators 300, 400, 480 and 490, the perimeter walls of cavity 440 may be angled outward from cavity top surface 452 to plate back surface 412 instead of vertical as shown in the figures. In these cases, the Si sidewalls of the cavity will have an angle and the layers of the Bragg reflectors 454, 484 and 494 will be stacked, such as by being deposited over the angled sidewalls. This approach has a benefit of having direct bonding of the plate to the Si substrate material at the perimeter of the cavities and/or in the areas between multiple XBARs formed on a single chip, which is good for not forming electrical parasitics with RF filter pads on top of the resonator that form connections to external circuitry. In some sense this arrangement is more desirable than the blanket layers of Bragg reflector material layers 422, 424, 426 and/or 428 sandwiched between the substrate cavity bottom surface 452 and a back surface of the diaphragm 415 around the perimeter 145 of cavity 440.

In some cases, instead of tungsten and SiO2 layers, the resonators herein, may use a different conductive metal for the W and/or a different dielectric for the SiO2.

Figure 5:
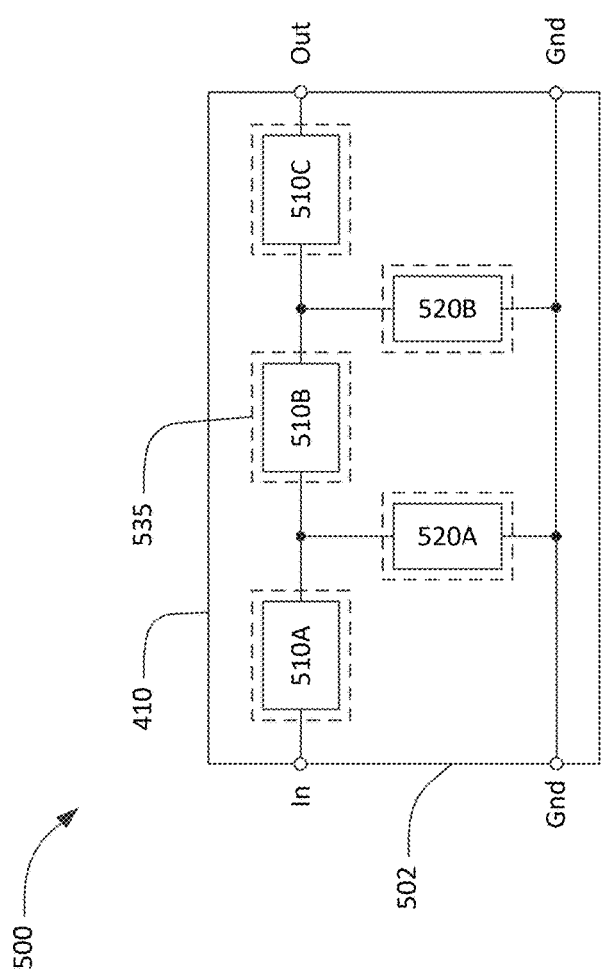
FIG. 5 is a schematic block diagram of a filter using XBARs having resonators with SMR pedestals.

FIG. 5 is a schematic circuit diagram and layout for a high frequency band-pass filter 500 using XBARs where the two connections to an XBAR that are shown are connections to the two busbars of the XBAR. The filter 500 has a conventional ladder (or half ladder) filter architecture including three series resonators 510A, 510B, 510C and two shunt resonators 520A, 520B on one die or chip 502. Any number of or all of resonators 510A, 510B, 510C, 520A and 520B may be a resonator having a Bragg reflector as described herein. The three series resonators 510A, 510B, and 510C are connected in series between a first port and a second port (hence the term "series resonator"). In FIG. 5, the first and second ports are labeled "In" and "Out", respectively. However, the filter 500 is bidirectional and either port may serve as the input or output of the filter. The two shunt resonators 520A, 520B are connected from nodes between the series resonators to ground. A filter may contain additional reactive components, such as inductors, not shown in FIG. 5. All the shunt resonators and series resonators are XBARs. The inclusion of three series and two shunt resonators is exemplary. A filter may have more or fewer than five total resonators, more or fewer than three series resonators, and more or fewer than two shunt resonators. Typically, all of the series resonators are connected in series between an input and an output of the filter. All of the shunt resonators are typically connected between ground and the input, the output, or a node between two series resonators.

The three series resonators 510A, B, C and the two shunt resonators 520A, B of the filter 500 are formed on a single plate 410 of piezoelectric material bonded to a silicon substrate (not visible). Each resonator includes a respective IDT (not shown), with at least the fingers of the IDT disposed over a cavity in the substrate. In this and similar contexts, the term "respective" means "relating things each to each", which is to say with a one-to-one correspondence. In FIG. 5, the cavities are illustrated schematically as the dashed rectangles (such as the rectangle 535). In this example, each IDT is disposed over a respective cavity. In other filters, the IDTs of two or more resonators may be disposed over a single cavity.

Each of the resonators 510A, 510B, 510C, 520A, 520B in the filter 500 has resonance where the admittance of the resonator is very high and an anti-resonance where the admittance of the resonator is very low. The resonance and anti-resonance occur at a resonance frequency and an anti-resonance frequency, respectively, which may be the same or different for the various resonators in the filter 500. In over-simplified terms, each resonator can be considered a short-circuit at its resonance frequency and an open circuit at its anti-resonance frequency. The input-output transfer function will be near zero at the resonance frequencies of the shunt resonators and at the anti-resonance frequencies of the series resonators. In a typical filter, the resonance frequencies of the shunt resonators are positioned below the lower edge of the filter's passband and the anti-resonance frequencies of the series resonators are position above the upper edge of the passband.

In some cases, the pedestals further provide a path for thermal cooling of the XBAR in combination with thick IDT electrodes or busbars (e.g., that may be used in high power XBARs). This may be an important part or benefit of the XBARs with SMR pedestals herein. For example, two benefits of the pedestals may be to provide mechanical support for the very thin diaphragm and to provide a thermally conductive path for heat to flow from the diaphragm and IDT electrodes to the substrate 120, 320 or 420.

Description of Methods

Figure 6:
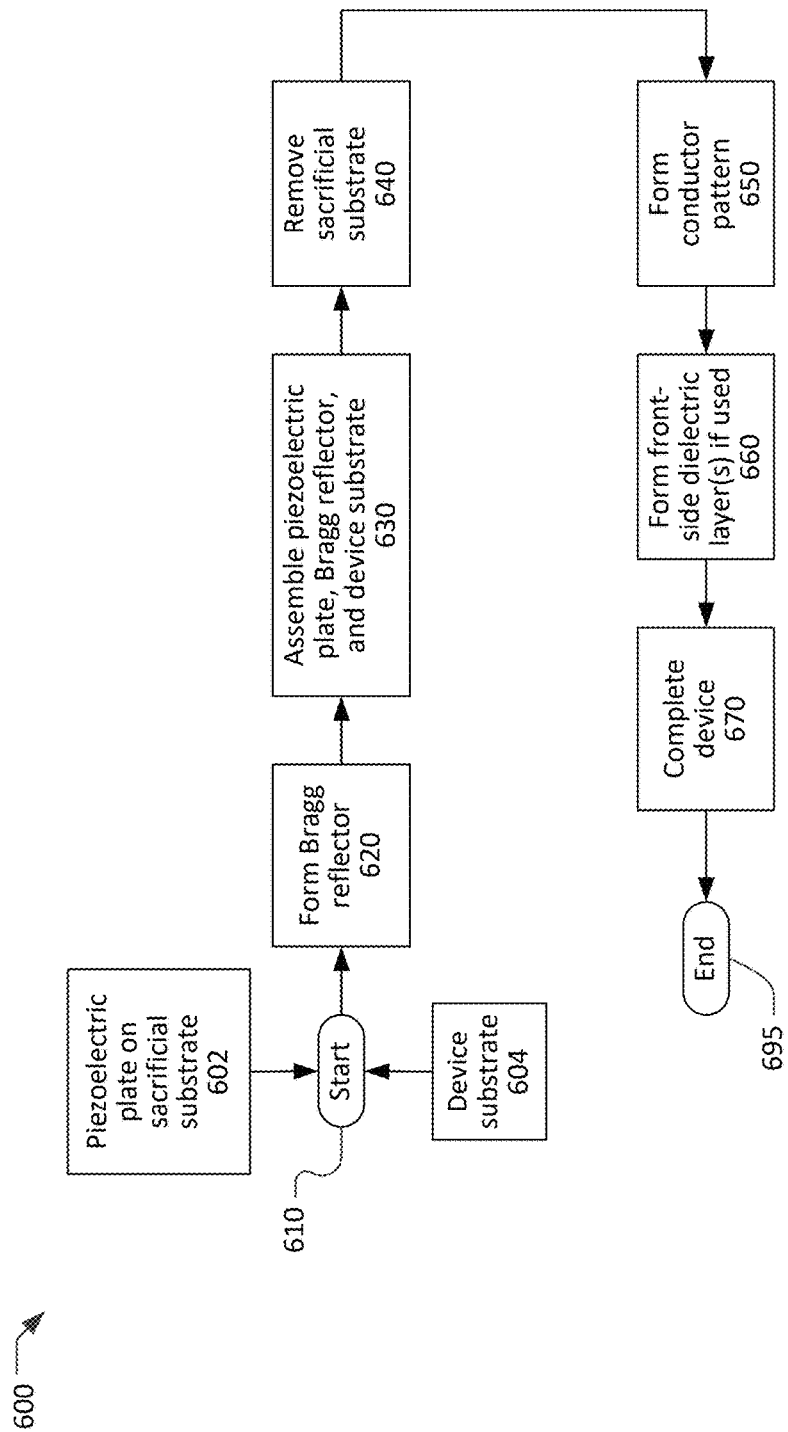
FIG. 6 is a flow chart of a process for fabricating XBARs with SMR pedestals.

FIG. 6 is a simplified flow chart of a method 600 for making an XBAR or a filter incorporating XBARs. The method 600 starts at 610 with a piezoelectric film disposed on a sacrificial substrate 602 and a device substrate 604. The method 610 ends at 695 with a completed XBAR or filter having a Bragg reflector and pedestals as noted herein. The flow chart of FIG. 6 includes only major process steps. Various conventional process steps (e.g. surface preparation, chemical mechanical processing (CMP), cleaning, inspection, deposition, photolithography, baking, annealing, monitoring, testing, etc.) may be performed before, between, after, and during the steps shown in FIG. 6.

The piezoelectric plate at 602 may be as described herein. Thin plates of single-crystal piezoelectric materials may be bonded to a non-piezoelectric substrate. The piezoelectric plate may be, for example, Z-cut, rotated Z-cut, or rotated Y-cut lithium niobate or lithium tantalate. In some cases, it is Y-cut or rotated Y-cut lithium niobate. The piezoelectric plate may be some other material and/or some other cut. Both lithium niobate and lithium tantalate plates may be bonded to various substrates including silicon, quartz, and fused silica.

The substrate 604 may be silicon (as used in the previous examples) fused silica, quartz, or some other material. The substrate may be some other material that allows formation of deep cavities by etching or other processing.

At 620 an acoustic Bragg reflector, such as reflector 154, 354, 454, 484, 494 or 444, is formed by depositing alternating layers of high acoustic impedance and low acoustic impedance materials. At 620, some or all of the layers of the acoustic Bragg reflector may be deposited on the bottom surface of the piezoelectric plate that is on the sacrificial substrate 602, on a bottom surface of a cavity in substrate 604 and/or as blanket layers on a top surface of the device substrate 604. After depositing some or all layers of the reflector, the pedestals of the reflector are formed. The layers of the Bragg reflector and pedestals may be formed at 620 as noted for any of FIG. 3A, 4A, 4D, 4F, 4G or 7-9.

At 630, the piezoelectric plate on the sacrificial substrate 602 and the device substrate 604 may be bonded such that the layers of the acoustic Bragg reflector are sandwiched between the piezoelectric plate and the device substrate. The plate may be attached to or mounted onto the substrate so that the back surface of the piezoelectric diaphragm is attached to or bonded to the top surfaces of the pedestals, and the top surfaces of the pedestals are opposite locations on the plate where some or all interleaved fingers of the IDT will be formed at step 650.

The piezoelectric plate on the sacrificial substrate 602 and the device substrate 604 may be bonded using a wafer bonding process such as direct bonding, surface-activated or plasma-activated bonding, electrostatic bonding, or some other bonding technique. Note that, when one or more layers of the acoustic Bragg reflector are deposited on both the piezoelectric plate and the device substrate, the bonding will occur between or within layers of the acoustic Bragg reflector.

After the piezoelectric plate on the sacrificial substrate 602 and the device substrate 604 may be bonded, the sacrificial substrate, and any intervening layers, are removed at 640 to expose the surface of the piezoelectric plate (the surface that previously faced the sacrificial substrate). The sacrificial substrate may be removed, for example, by material-dependent wet or dry etching or some other process.

In some cases, at 630 the Bragg reflector layers are deposited and the pedestals are etched out through sequential selective etching of a few layers, using the same lithography. After pedestals are formed the LN plate with sacrificial Si substrate is bonded to the pedestals thus forming air cavities between the pedestals. Then, the end sacrificial Si substrate is etched away leaving the LN membrane fixed on the pedestals and standing over the air cavities.

In other cases, at 630 a few layers of the Bragg reflector are deposited on the LN plate with sacrificial Si substrate. Then the layers of the pedestal portion of the Bragg reflector are subsequently etched through a lithography mask, down to the LN plate. The formed pedestals together with the LN/Si base are then bonded over a Si substrate having blanket formed mirror portion layers of the Bragg reflector on top of the Si substrate prior to bonding. The sacrificial Si substrate is then etched away so that a LN membrane is formed over air gaps between the pedestals.

Both of the examples above can also be performed using a lift-off process to remove areas of the pedestal portion between the pedestals instead of etching through lithography mask.

A variation of the process 600, the layers of the acoustic Bragg reflector are deposited on a surface of another substrate or a reflector substrate to be mounted to the bottom of substrate 604 so the reflector is located within a back side etched cavity. The reflector substrate may be mounted onto substrate 604 prior to or after mounting the plate on the top of the substrate 604. In either case, the back surface of the piezoelectric diaphragm is attached to or bonded to the top surfaces of the pedestals, and the top surfaces of the pedestals are opposite locations on the plate where some or all interleaved fingers of the IDT will be formed at step 650. The layers of the Bragg reflector and pedestals may be formed in this variation as noted for FIG. 1.

A conductor pattern, including IDTs of each XBAR, is formed at 650 by depositing and patterning one or more conductor layer on the surface of the piezoelectric plate that was exposed when the sacrificial substrate was removed at 640. The conductor pattern may be, for example, aluminum, an aluminum alloy, copper, a copper alloy, or some other conductive metal. Optionally, one or more layers of other materials may be disposed below (i.e. between the conductor layer and the piezoelectric plate) and/or on top of the conductor layer. For example, a thin film of titanium, chrome, or other metal may be used to improve the adhesion between the conductor layer and the piezoelectric plate. A conduction enhancement layer of gold, aluminum, copper or other higher conductivity metal may be formed over portions of the conductor pattern (for example the IDT bus bars and interconnections between the IDTs).

The conductor pattern may be formed at 650 by depositing the conductor layer and, optionally, one or more other metal layers in sequence over the surface of the piezoelectric plate. The excess metal may then be removed by etching through patterned photoresist. The conductor layer can be etched, for example, by plasma etching, reactive ion etching, wet chemical etching, and other etching techniques.

Alternatively, the conductor pattern may be formed at 650 using a lift-off process. Photoresist may be deposited over the piezoelectric plate. and patterned to define the conductor pattern. The conductor layer and, optionally, one or more other layers may be deposited in sequence over the surface of the piezoelectric plate. The photoresist may then be removed, which removes the excess material, leaving the conductor pattern.

Forming the conductor pattern at 650 includes forming fingers of the pattern at finger locations such that the top surfaces of the pedestals of the Bragg reflector are opposite some or all interleaved fingers of the IDT.

At 660, one or more optional front-side dielectric layers may be formed by depositing one or more layers of dielectric material on the front side of the piezoelectric plate. The one or more dielectric layers may be deposited using a conventional deposition technique such as sputtering, evaporation, or chemical vapor deposition. The one or more dielectric layers may be deposited over the entire surface of the piezoelectric plate, including on top of the conductor pattern. Alternatively, one or more lithography processes (using photomasks) may be used to limit the deposition of the dielectric layers to selected areas of the piezoelectric plate, such as only between the interleaved fingers of the IDTs. Masks may also be used to allow deposition of different thicknesses of dielectric materials on different portions of the piezoelectric plate.

After the conductor pattern and optional front-side dielectric layer are formed at 650 and 660, the filter device may be completed at 670. Actions that may occur at 670 including depositing and patterning additional metal layers to form conductors other than the IDT conductor pattern; depositing an encapsulation/passivation layer such as SiO2 or Si3O4 over all or a portion of the device; forming bonding pads or solder bumps or other means for making connection between the device and external circuitry; excising individual devices from a wafer containing multiple devices; other packaging steps; and testing. Another action that may occur at 670 is to tune the resonant frequencies of the resonators within the device by adding or removing metal or dielectric material from the front side of the device. After the filter device is completed, the process ends at 695.

A variation of the process 600 starts with a single-crystal piezoelectric wafer at 602 instead of a thin piezoelectric plate on a sacrificial substrate of a different material. Ions are implanted to a controlled depth beneath a surface of the piezoelectric wafer (not shown in FIG. 6). The portion of the wafer from the surface to the depth of the ion implantation is (or will become) the thin piezoelectric plate and the balance of the wafer is the sacrificial substrate. The acoustic Bragg reflector is formed at 620 as previously described and the piezoelectric wafer and device substrate are bonded at 630 such that the acoustic Bragg reflector is disposed between the ion-implanted surface of the piezoelectric wafer 602 and the device substrate 604. At 640, the piezoelectric wafer may be split at the plane of the implanted ions (for example, using thermal shock), leaving a thin plate of piezoelectric material exposed and bonded to the acoustic Bragg reflector. The thickness of the thin plate piezoelectric material is determined by the energy (and thus depth) of the implanted ions. The process of ion implantation and subsequent separation of a thin plate is commonly referred to as "ion slicing".

Figure 7C:
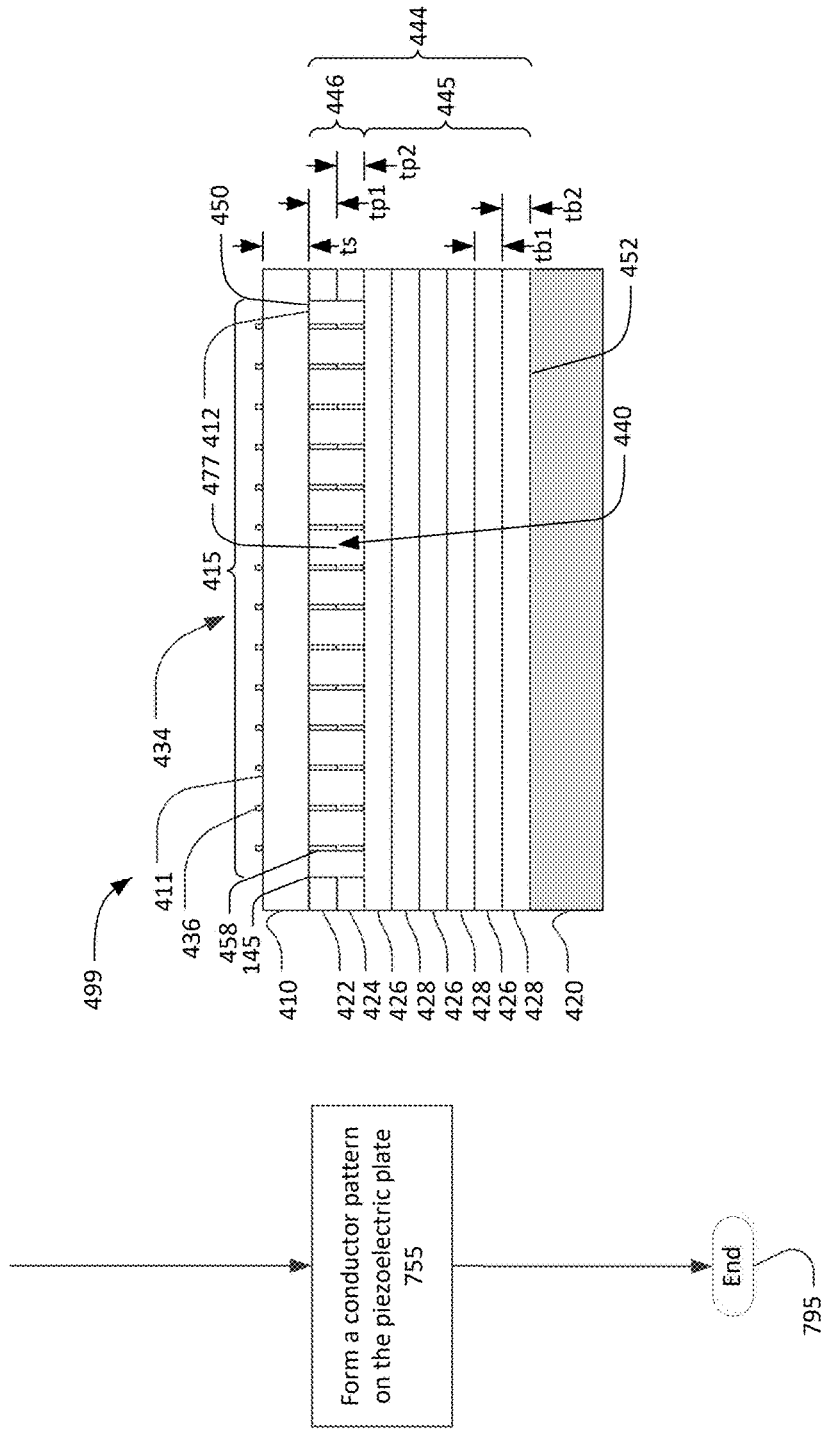

FIGS. 7A, 7B and 7C (collectively "FIG. 7") are a flow chart of a process 700 for fabricating XBARs with SMR pedestals. Process 700 includes fabricating an acoustic resonator 499 with a Bragg reflector 444 configured to reflect shear acoustic waves at a resonance frequency of the acoustic resonator. The process 700 starts at 715 and ends at 795 with a completed XBAR or filter 499. In some cases, the process 700 may be for or may be included in the forming of XBAR 100, 300, 360, 400, 480, 490, 499 and/or of filter 500.

The process 700 may be repeated to form any number of XBARs or filters. It may be repeated to form series XBARS on certain areas of a wafer and repeated to form series XBARS on some areas of a silicon wafer and forming shunt XBARS on other areas of the silicon wafer, such as to form filter 500. The flow chart of FIG. 7 includes only major process steps. Various conventional process steps (e.g., surface preparation, chemical mechanical processing (CMP), cleaning, inspection, deposition, photolithography, baking, annealing, monitoring, testing, etc.) may be performed before, between, after, and during the steps shown in FIG. 7.

The process 700 starts at 715 with forming interleaved Bragg reflector layers 426 and 428 on a top surface 452 of a silicon substrate 420 and masking over pedestal locations 418 for pedestals of a Bragg reflector to form device 701. The Bragg reflector layers 426 and 428 may be interleaved to form a stack of all of the layers that form a Bragg reflector such as reflector 154, 354, 454, 484, 494 or 444. That is, forming at 715 may include depositing the total number of Bragg reflector layers of a Bragg reflector on a substrate. At 715, substrate 420 may be the device substrate 604.

Forming Bragg reflector layers at 715 may include blanket layering a total number of blanket layers that alternate between Bragg reflector layers that form pedestal layers 422 and 424; and mirror layers 426 and 428.

Masking at 715 may include blanket layering a mask on top surface 453 of the Bragg reflector layers 426 and 428; then patterning the mask to leave remaining patterned mask portions 417 over the locations 418 for the pedestals 458 and over the perimeter 145 of cavity 440.

Next, at 725 a selected number of Bragg reflector layers 426 and 428 are etched to form pedestals 458 and device 702. Etching may include removing a selected number of layers 426 and 428 from areas of surface 453 that are not at portions 417 of the patterned mask to form the pedestals 458. The etching may be selectively etching a layer of a layers 426; then selectively etching a layer of a layers 428; and repeating those two selective etches in sequence until a selected number of layers 426 and 428 are removed to form pedestals 458. Etching at 725 may use the same lithography (e.g., portions 417) and use different selective etching with each next layer acting as an etch stop. Selectively etching of a layer 426 may use the layer 428 below as an etch stop. Similarly, selectively etching of a layer 428 may use the layer 426 below as an etch stop.

Etching at 725 may be etching to remove one or more top layers of the Bragg reflector layers 426 and 428 from between the pedestals locations 417 to form the pedestals 458 and to form a cavity 440 with a cavity top surface perimeter 145. Device 702 is shown with acoustic Bragg reflector 444 with a total number of 8 layers, a mirror portion 445 of the reflector has a first number 6 of the total number of layers and the pedestals portion 446 (of pedestals 458) has a remaining number 2 of the total number of layers. It is considered that a different number of total reflector layers, mirror portion layers and pedestal layers may be used in a Bragg reflector as noted herein. The total number of reflector layers can be more or fewer than 8 such as by being 4, 6, 10, 12, 14, 16, etc. Also, each of the pedestal and reflector portions could have a different number of the totally layers. Each could have half or the total layers, such as noted for device 480. In another case the pedestal portion 446 could have all of the total layers as noted for device 490. Etching at 725 may be forming a Bragg reflector such as reflector 154, 354, 454, 484, 494 or 444.

Etching at 725 forms perimeter 145 disposed around cavity 440, such as a cavity 440 of air cavities 477 etched out between pedestals 458. Device 702 has perimeter 145 of the Bragg reflector layers 426 and 428 disposed around the cavity, such as shown in FIG. 4G.

At 735 a top surface of the pedestals 419 is bonded to a piezoelectric plate 410 having a sacrificial substrate 421 to form device 703. Bonding at 735 may include first removing the patterned mask portions 417 using a process that does not remove the pedestals 458, perimeter 145 or top layer 426 of mirror portion 445 prior to bonding to the plate. This removing may be removing the lithography used to etch at 725.

Bonding at 735 may be bonding a piezoelectric plate 410 with sacrificial substrate 421 to the etched pedestals 458 and perimeter 145 of the air cavities 477 around the pedestals of portion 445 within cavity 440. Bonding at 735 may include mounting a piezoelectric plate back surface 412 onto the reflector 444 top surface except for a portion of the piezoelectric plate disposed over the air cavities 477.

Sacrificial substrate 421 may be formed of any material that can be subsequently removed by selectively etching, dissolving, or some other process that removes substrate 421 with respect to the material of plate 410, and optionally with respect to substrate 420. The sacrificial material may be silicon Si; silicon nitride, $Si_3N_4$; phosphosilicate glass (PSG); or spin-on glass (SOG). It may be other materials that can be washed, wet etched or dry etched off of the plate.

Bonding at 735 may include bonding a top surface of the pedestals 419 and perimeter 145 to a piezoelectric plate 410 having plate front 412 and plate back 411 surfaces, with a sacrificial substrate 421 bonded to the plate back surface 412. Bonding the plate may create acoustic Bragg reflector 444 sandwiched between a substrate cavity bottom surface 452 of the silicon substrate 420 and a back surface 412 of the piezoelectric plate where the acoustic Bragg reflector is configured to reflect shear acoustic waves at a resonance frequency of the acoustic resonator completed at 795. Bonding at 735 may include bonding plate 410 to surface 453 of layers 426 and 428 around perimeter 145, such as shown in FIG. 4G.

At 745 the sacrificial substrate 421 is removed from the plate 410 front surface 411 to leave the piezoelectric membrane and diaphragm 415 bonded to the pedestals 458 and standing over the cavity 440 to form device 704.

Removing the sacrificial substrate 421 may include selectively etching away the sacrificial substrate material with respect to the plate 410 and the silicon substrate 420 to leave the piezoelectric membrane fixed on the pedestals 458 and standing over the cavity 440. Removing at 421 may be etching away the sacrificial substrate 421 to leave the plate bonded on and fixed to the pedestals 458 and standing over the air 477 cavities within perimeter 145.

When the sacrificial material is silicon it may be removed as known in the art. When the sacrificial material is silicon nitride, it may be etched by Phosphoric etching may include using phosphoric acid (H3PO4). When the sacrificial material is phosphosilicate glass (PSG), it may be etched with vapor Hydrogen Fluoride (HF) such as an etchant mixture of carboxylic acid, hydrogen fluoride, and water. When the sacrificial material is spin-on glass (SOG), it may be etched with HF acid.

At 755 at least one conductor pattern is formed on the plate front surface 411 to form device 499. Forming the pattern at 755 includes forming at least one conductor pattern comprises forming an interdigital transducer (IDT) 434 with interleaved fingers 436 disposed on the membrane to form a diaphragm 415 over a cavity 440.

Forming the IDT may create device 499 as noted with pedestals that support the back surface of the piezoelectric plate opposite a plurality of the interleaved fingers of the IDT; and that are attached to the diaphragm at locations under or opposite locations where some or all of the fingers are disposed on diaphragm. Forming at 755 may be or include descriptions at 650 and/or 660.

The filter device is then completed at 795. Actions that may occur at 795 include depositing an encapsulation/passivation layer such as SiO$_2$ or Si$_3$O$_4$ over all or a portion of the device and/or forming bonding pads or solder bumps or other means for making connection between the device and external circuitry. Other actions at 795 may include excising individual devices from a wafer containing multiple devices; other packaging steps; and testing. Another action that may occur at 795 is to tune the resonant frequencies of the resonators within the device by adding or removing metal or dielectric material from the front side of the device. After the filter device is completed, the process ends at 795.

Figure 8A:
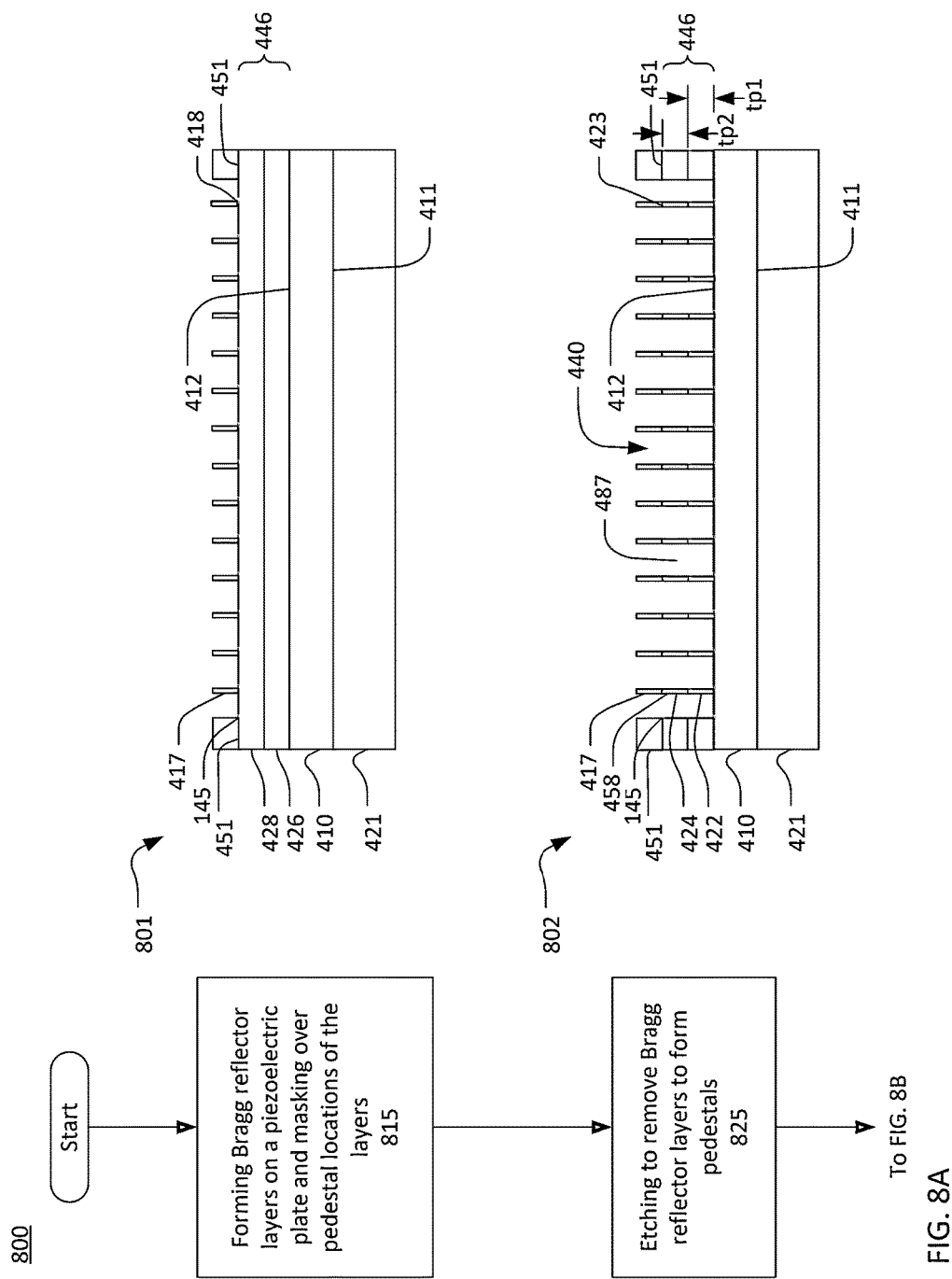
Figure 8C:
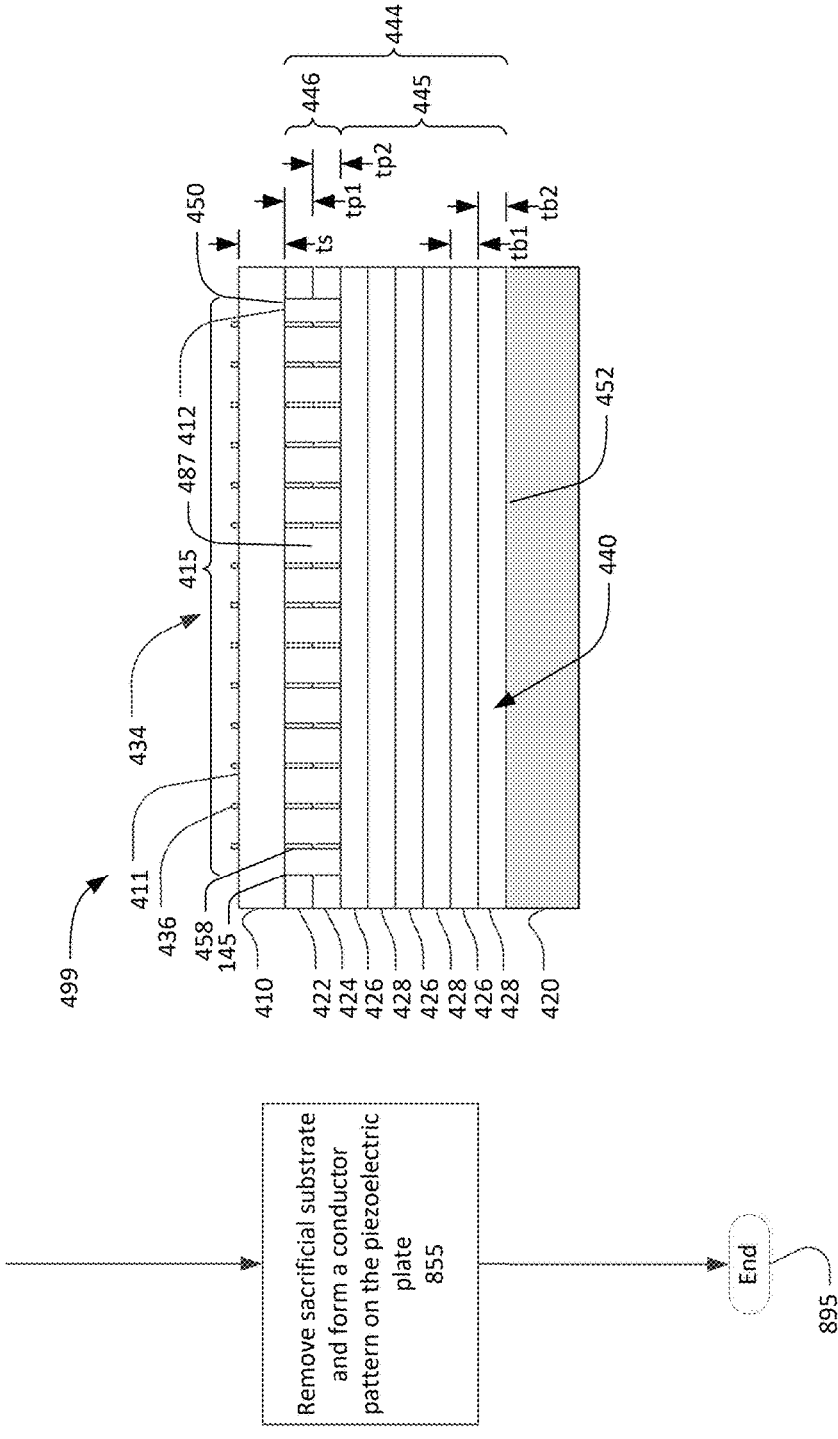

FIGS. 8A, 8B and 8C (collectively "FIG. 8") are a flow chart of a process 800 for fabricating XBARs with SMR pedestals. Process 800 includes fabricating an acoustic resonator 499 with a Bragg reflector 444 configured to reflect shear acoustic waves at a resonance frequency of the acoustic resonator. The process 800 starts at 815 and ends at 895 with a completed XBAR or filter 499. In some cases, the process 800 may be for or may be included in the forming of XBAR 100, 300, 360, 400, 480, 490, 499 and/or of filter 500.

The process 800 may be repeated to form any number of XBARs or filters. It may be repeated to form series XBARS on certain areas of a wafer and repeated to form series XBARS on some areas of a silicon wafer and forming shunt XBARS on other areas of the silicon wafer, such as to form filter 500. The flow chart of FIG. 8 includes only major process steps. Various conventional process steps (e.g., surface preparation, chemical mechanical processing (CMP), cleaning, inspection, deposition, photolithography, baking, annealing, monitoring, testing, etc.) may be performed before, between, after, and during the steps shown in FIG. 8.

The process 800 starts at 815 with forming interleaved Bragg reflector layers 426 and 428 are formed on bottom surface 412 of a piezoelectric plate 410 having a sacrificial substrate 421, and masking over pedestal locations 418 for pedestals of the Bragg reflector to form device 801.

At 815 the Bragg reflector layers 426 and 428 may be interleaved to form only the pedestal portion 446 layer subset of the total number of Bragg reflector layers of a Bragg reflector on a piezoelectric plate. In other cases, forming at 815 may include depositing the layers to form a stack of some or all of the layers that form a Bragg reflector such as reflector 154, 354, 454, 484, 494 or 444. At 815, piezoelectric plate 410 may be the piezoelectric plate 602.

Forming Bragg reflector layers at 815 may include blanket layering the pedestal portion 446 number of blanket layers that alternate between Bragg reflector layers that form pedestal layers 422 and 424. Piezoelectric plate 410 has plate front 412 and plate back 411 surfaces, with a sacrificial substrate 421 bonded to the plate back surface 412.

Sacrificial substrate 421 may be formed of any material that can be subsequently removed with respect to plate 410 as noted for process 700.

Masking at 815 may include blanket layering a mask on bottom surface 451 of the pedestal portion 446 of Bragg reflector layers 426 and 428; then patterning the mask to leave remaining patterned mask portions 417 over the locations 418 for the pedestals 458 and over the perimeter 145 of cavity 440.

Next, at 825 all of the pedestal portion 446 Bragg reflector layers 426 and 428 are etched down to the back surface 412 of plate 410 to form pedestals 458 and device 802. Etching may include removing pedestal portion layers 426 and 428 from areas of surface 451 that are not at portions 417 of the patterned mask to form the pedestals 458 of layers 422 and 424. The etching may be selectively etching a layer of a layers 426; then selectively etching a layer of a layers 428; and repeating those two selective etches in sequence until a selected number of layers 426 and 428 are removed to form pedestals 458. Etching at 725 may use the same lithography (e.g., portions 417) and use different selective etching with each next layer acting as an etch stop. Selectively etching of a layer 426 may use the layer 428 below as an etch stop. Similarly, selectively etching of a layer 428 may use the layer 426 below as an etch stop. In other cases, both layers 426 and 428 are selectively etched at the same time with respect to the material of plate 410, and optionally with respect to material of substrate 421.

Etching at 825 may be etching to remove all of pedestal portion 446 layers of the Bragg reflector layers 426 and 428 from between the pedestals locations 417 to form the pedestals 458 and to form a cavity 440 with a cavity top surface perimeter 145.

Cavity 440 may be air cavities 477 etched out between pedestals 458 of etched of layers 422 and 424 within perimeter 145 of the Bragg reflector layers 426 and 428 disposed around the cavity 440, such as shown in FIG. 4G and step 755.

In some embodiments, instead of masking over locations 417 at 815 and etching at 825, the layers 426 and 428 between the pedestal locations 417 may be removed by using a lift-off process instead of etching around the photolithography mask. In this case, a lift-off process removes all of the pedestal portion 446 of Bragg reflector layers from between the pedestals locations to form the pedestals and to form a cavity 440 with a cavity top surface perimeter 145. Here, instead of masking at 815 and etching at 825, a lift off process uses a lift-off photoresist mask formed over the bottom surface 451 of the pedestal portion 446 of Bragg reflector layers 426 and 428, between the pedestal locations instead of a mask over the pedestal locations 417. Then, the photoresist mask is removed, lifting off the top layers of the Bragg reflector between the pedestals to form pedestal 458 to form device 802.

At 835 interleaved Bragg reflector layers 426 and 428 or mirror portion 445 are formed on top surface 452 of substrate 420 to form device 803. Device 803 is a different and separate device, substrate or wafer than device 802. At 835 the Bragg reflector layers 426 and 428 may be interleaved to form only the mirror portion 445 layer subset of the total number of Bragg reflector layers of a Bragg reflector on a piezoelectric plate. In other cases, forming at 835 may include depositing the layers to form a stack of some or all of the layers that form a Bragg reflector such as reflector 154, 354, 454, 484, 494 or 444. At 835, substrate 420 may be the device substrate 604.

Forming Bragg reflector layers at 835 may include blanket layering the mirror portion 445 number of blanket layers that alternate between Bragg reflector layers that form mirror layers 426 and 428.

At 845 a bottom surface of the pedestals 423 formed on plate 410 having substrate 421 is bonded to a top surface 425 of the mirror portion 445 to form device 804. Bonding at 845 may include first removing the patterned mask portions 417 using a process that does not remove the pedestals 458, perimeter 145 or plate 410 prior to bonding to the mirror portion 445. This removing may be removing the lithography used to etch at 825. Bonding at 845 may be bonding a bottom surface 423 of the pedestals and top surface 451 of the pedestal layers around perimeter 145 to the top surface 425 of the layers of the mirror portion 445, such as shown in FIG. 4G.

Bonding at 845 may be bonding bottom surface 423 of the etched pedestals 458 and perimeter 145 of air cavities 487 around the pedestals of portion 445 within cavity 440 of piezoelectric plate 410 with sacrificial substrate 421 to top surface 451 of mirror portion 445 formed on substrate 420. Bonding at 845 may include mounting top surface 425 onto the pedestals portion 445 bottom surface except for a portion of the top surface 425 disposed under the air cavities 487.

Bonding the bottom surface of the pedestals 423 to a top surface 425 may create acoustic Bragg reflector 444 sandwiched between a substrate cavity bottom surface 452 of the silicon substrate 420 and a back surface 412 of the piezoelectric plate where the acoustic Bragg reflector is configured to reflect shear acoustic waves at a resonance frequency of the acoustic resonator completed at 895.

Device 804 is shown with acoustic Bragg reflector 444 with a total number of 8 layers, a mirror portion 445 of the reflector has a first number 6 of the total number of layers and the pedestals portion 446 (of pedestals 458) has a remaining number 2 of the total number of layers. It is considered that a different number of total reflector layers, mirror portion layers and pedestal layers may be used in a Bragg reflector as noted herein. Bonding at 845 may be forming a Bragg reflector such as reflector 154, 354, 454, 484, 494 or 444.

At 855 the sacrificial substrate 421 is removed from the plate 410 front surface 411 to leave the piezoelectric membrane and diaphragm 415 bonded to the pedestals 458 and standing over the cavity 440. After removing substrate 421 at least one conductor pattern is formed on front surface 411 of the plate 410 to form device 499.

Removing the sacrificial substrate 421 may include using etching chemistries, forming air cavities and/or selectively etching as noted at 745. At 855 at least one conductor pattern is formed on the plate front surface 411 to form device 499 such as noted at 755.

The filter device is then completed at 895, such as noted for completing the device at 795.

The acoustic Bragg reflector 444 is configured to reflect shear acoustic waves at a resonance frequency of the acoustic resonator 499. The acoustic Bragg reflector 444 may use blanket layers 426 and 428 of mirror SiO2 and W formed across the entire substrate 420 and then areas around the pedestals 485 etched to form cavities 440. In this case, the perimeter of the cavities 440 are mirror material of blanket layers 426 and 428 which do not effect performance of the XBAR because they do not create.

The concepts of processes 700 and/or 800 can be used to form devices other than device 499, such to form as any of XBARs 100, 300, 360, 400, 480, 490 and/or of filter 500 having a perimeter of the Bragg reflector layers 246 and 248; and/or a different number of layers in their mirror and pedestal portions. Here, layers 426 and 428 may be etched away from the perimeter 145 at 715 or (815 and 835) and substrate material of substrate 420 is deposited in their place prior to the next step.

Figure 9B:
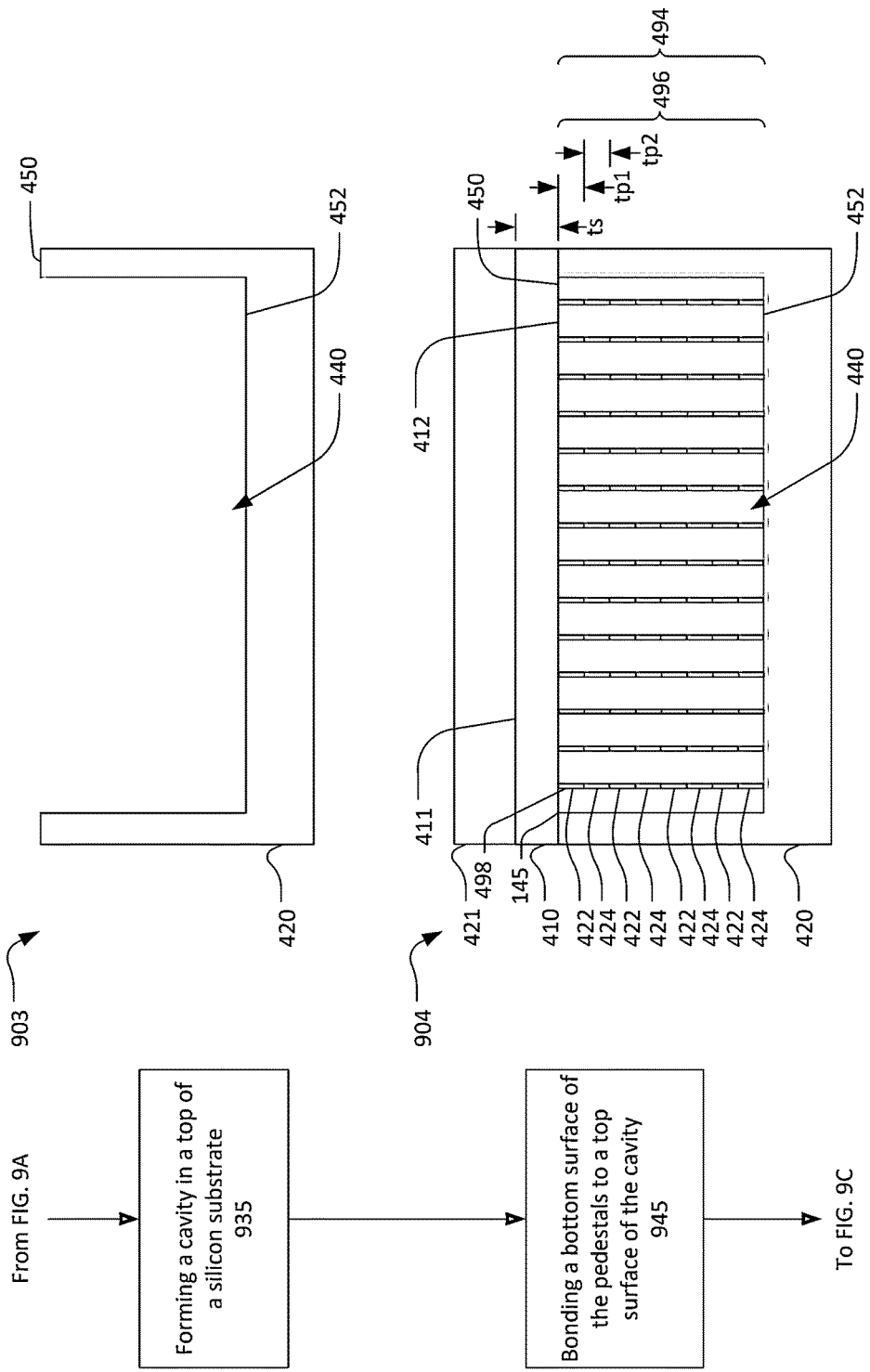

FIGS. 9A, 9B and 9C (collectively "FIG. 9") are a flow chart of a process 900 for fabricating XBARs with SMR pedestals. Process 900 includes fabricating an acoustic resonator XBAR 490 with a Bragg reflector 494 configured to reflect shear acoustic waves at a resonance frequency of the acoustic resonator. The process 900 starts at 915 and ends at 995 with a completed XBAR or filter 490. In some cases, the process 900 may be for or may be included in the forming of XBAR 100, 300, 360, 400, 480, 490, 499 and/or of filter 500.

The process 900 may be repeated to form any number of XBARs or filters. It may be repeated to form series XBARS on certain areas of a wafer and repeated to form series XBARS on some areas of a silicon wafer and forming shunt XBARS on other areas of the silicon wafer, such as to form filter 500. The flow chart of FIG. 9 includes only major process steps. Various conventional process steps (e.g., surface preparation, chemical mechanical processing (CMP), cleaning, inspection, deposition, photolithography, baking, annealing, monitoring, testing, etc.) may be performed before, between, after, and during the steps shown in FIG. 9.

The process 900 starts at 915 with forming interleaved Bragg reflector layers 426 and 428 are formed on bottom surface 412 of a piezoelectric plate 410 having a sacrificial substrate 421, and masking over pedestal locations 418 for pedestals of the Bragg reflector to form device 901.

At 915 the Bragg reflector layers 426 and 428 may be interleaved to form all of the total number of Bragg reflector layers of a Bragg reflector on a piezoelectric plate. In other cases, forming at 915 may include depositing the layers to form a stack of all of the layers that form a Bragg reflector such as reflector 154, 354, 454, 484, 494 or 444. At 915, piezoelectric plate 410 may be the piezoelectric plate 602.

Forming Bragg reflector layers at 915 may include blanket layering the total number of layers for Bragg reflector 444 that alternate between Bragg reflector layers that will form pedestal portion 496 layers 422 and 424. Piezoelectric plate 410 has plate front 412 and plate back 411 surfaces, with a sacrificial substrate 421 bonded to the plate back surface 412.

Sacrificial substrate 421 may be formed of any material that can be subsequently removed with respect to plate 410 as noted for process 700.

Masking at 915 may include blanket layering a mask on bottom surface 451 of the pedestal portion 496 of Bragg reflector layers 426 and 428; then patterning the mask to leave remaining patterned mask portions 417 over the locations 418 for the pedestals 458 but not over the perimeter 145 of cavity to be formed 441.

Next, at 925 all of the Bragg reflector layers 426 and 428 are etched down to the back surface 412 of plate 410 to form pedestals 498 and device 902. Etching may include removing pedestal portion layers 426 and 428 from areas of surface 451 that are not at portions 417 of the patterned mask to form the pedestals 498 of layers 422 and 424 and to remove layers 426 and 428 from a perimeter 145 of a cavity location 441. The etching may be selectively etching a layer of a layers 426; then selectively etching a layer of a layers 428; and repeating those two selective etches in sequence until a selected number of layers 426 and 428 are removed to form pedestals 498. Etching at 725 may use the same lithography (e.g., portions 417) and use different selective etching with each next layer acting as an etch stop. Selectively etching of a layer 426 may use the layer 428 below as an etch stop. Similarly, selectively etching of a layer 428 may use the layer 426 below as an etch stop. In other cases, both layers 426 and 428 are selectively etched at the same time with respect to the material of plate 410, and optionally with respect to material of substrate 421.

Etching at 925 may be etching to remove all of pedestal portion 496 layers of the Bragg reflector layers 426 and 428 from between the pedestals locations 417 to form the pedestals 498 and to remove layers 426 and 428 from a perimeter 145 of a cavity location 441 down to surface 412.

Cavity location 441 may have air cavities 497 etched out between pedestals 498 of etched layers 422 and 424 within perimeter area 145 of the Bragg reflector layers 426 and 428 disposed around the cavity 440, such as shown in FIG. 3A, 4A, 4D or 4F.

At 935 a cavity 440 is formed in a top surface 450 of a silicon substrate 420 to form device 903. At 935 the cavity 440 may be formed, for example, by etching as noted for forming cavity 340 in the substrate 320. This type of cavity 440 may be a swimming pool cavity At 945 a bottom surface 423 of the pedestals 498 formed on plate 410 having substrate 421 are bonded to a top surface 452 of the substrate cavity 440 to form device 904. Bonding at 945 may include bonding a perimeter 145 of the substrate cavity top surface 450 to a bottom surface 412 of the plate 410.

Bonding at 945 may include first removing the patterned mask portions 417 using a process that does not remove the pedestals 498 or plate 410 prior to bonding to the substrate 420. This removing may be removing the lithography used to etch at 925.

Bonding at 945 may be bonding a bottom surface 423 of the pedestals to the top surface 452 of the substrate, such as shown in FIG. 4F. Bonding at 945 may be bonding a piezoelectric plate 410 with sacrificial substrate 421 to perimeter 145 of substrate 420, and bonding the etched pedestals 498 to surfaces 452 of substrate 420, thus creating air cavities 497 around the pedestals of portion 496 within cavity 440. Bonding at 945 may include mounting top surface 452 onto the pedestals 498 bottom surface 423 except for a portion of the top surface 452 disposed under the air cavities 497.

Bonding the bottom surface of the pedestals 423 to a top surface 452 may create acoustic Bragg reflector 494 sandwiched between a substrate cavity bottom surface 452 of the silicon substrate 420 and a back surface 412 of the piezoelectric plate where the acoustic Bragg reflector is configured to reflect shear acoustic waves at a resonance frequency of the acoustic resonator completed at 995.

Device 904 is shown with acoustic Bragg reflector 494 with a total number of 8 layers, no mirror portion 445 of the reflector and the pedestals portion 496 (of pedestals 498) has all 8 of the total number of layers. It is considered that a different number of total reflector layers, mirror portion layers and pedestal layers may be used in a Bragg reflector as noted herein. For example, the number of total Bragg layers of reflector 494 in pedestals 498 can be 5, 6, 7, 8 or up to 20. Bonding at 945 may be forming a Bragg reflector such as reflector 154, 354, 454, 484, 494 or 444.

At 955 the sacrificial substrate 421 is removed from the plate 410 front surface 411 to leave the piezoelectric membrane and diaphragm 415 bonded to the pedestals 498 and standing over the cavity 440. After removing substrate 421 at least one conductor pattern is formed on front surface 411 of the plate 410 to form device 499.

Removing the sacrificial substrate 421 may include using etching chemistries, forming air cavities and/or selectively etching as noted at 745. At 955 at least one conductor pattern is formed on the plate front surface 411 to form device 499 such as noted at 755.

The filter device is then completed at 995, such as noted for completing the device at 795.

The acoustic Bragg reflector 494 is configured to reflect shear acoustic waves at a resonance frequency of the acoustic resonator 490. The acoustic Bragg reflector 494 may use blanket layers 426 and 428 of mirror SiO2 and W formed across the entire substrate 420. Then areas around the pedestals 498 are etched to form cavities 440 and areas around and beyond the perimeter 145 are etched to the plate 410 so that when the bottom surface of the pedestals are bonded to the to surface of the cavity at 945; the perimeter 145 and areas beyond the perimeter of the cavity are the silicon material of the substrate 420. In this case the perimeter 145 and areas beyond are silicon which may perform better than the if they were pedestal layers 422 and 424 because the material of substrate 420 surrounding the cavity is silicon or high resistive silicon that does not include a tungsten layer 428 (or 424, see FIG. 4G). When the XBAR having reflector 494's silicon perimeter instead of a perimeter with a tungsten layer 428/424 is used in a filter layout the metal contact pads contacting the different resonators have smaller cross-talk as compared to the case when tungsten (W) metal layer 424/428 is underneath the piezoelectric plate around the perimeter 145. In some cases, the metal contact pads contacting that electrically connect the XBARs of a filter to a package have smaller cross-talk between adjacent XBARs or a single XBAR's busbar of the filter than a when tungsten (W) metal layer 424/428 is underneath the piezoelectric plate around the perimeter 145 thickness of the cavity 440.

These cross-talk capacitances may be inversely proportional to thickness of a dielectric or electrically insulating layer above the top or last electrically conductive layer in the perimeter, which is tungsten in the case of layer 424/428, but does not exist for resonator 494. In other words, a maximum thickness of a dielectric layer 422/426 above the tungsten or another conductive layer beyond the perimeter 145 can be achieved by using substrate 420 instead of a stack having layer 424 or 428

In some cases, bonding the plate 410 to the silicon material of substrate 420 around the perimeter 145 uses an SiO2 bonding layer between the plate and material of 420 and includes a beneficial charge trap layer between the bonding SiO2 and silicon material of substrate 420 in order to minimize the interface conductivity between the bonding SiO2 and substrate 420. The charge trap layer may be important to get the lower cross-talk benefit of using the high resistive silicon below the piezoelectric plate 410. In this view the bonding SiO2 can be formed through oxidation of the Silicon (usually a poly Si layer covering the Si substrate).

The concepts of process 900 can be used to form devices other than device 490, such to form as any of XBARs 100, 300, 360, 400, 480, 499 and/or of filter 500 having a perimeter of the substrate 420; and/or a different number of layers in their mirror and pedestal portions. Here, layers 426 and 428 not may be etched away from the perimeter 145 at 925.

In some embodiments, instead of etching at 825 or 925, the layers 426 and 428 between the pedestal locations 418 may be removed by using a lift-off process instead of etching through lithography mask. In some embodiments, instead of masking over locations 417 at 915 and etching at 925, the layers 426 and 428 between the pedestal locations 417 and at and perimeter 145 may be removed by using a lift-off process instead of etching around the photolithography mask. In this case, a lift-off process removes all of the pedestal portion 496 of Bragg reflector layers from between the pedestals locations to form the pedestals 498 and to form a cavity location 441. Here, instead of masking at 915 and etching at 925, a lift off process uses a lift-off photoresist mask formed over the bottom surface 451 of the pedestal portion 496 of Bragg reflector layers 426 and 428, between the pedestal locations instead of a mask over the pedestal locations 417. Then, the photoresist mask is removed, lifting off the top layers of the Bragg reflector between the pedestals to form pedestal 498 to form device 902.

In some embodiments, prior to bonding at 735, 845 or 945, a sacrificial material if formed in the air cavities 477, 487 or 497 between the pedestals of the pedestal portion. Then, after bonding, 1) holes are formed in the perimeter 145 beside and lateral to the air cavities; and 2) the sacrificial material in the air cavities is etched away through the holes. Forming the holes and etching the sacrificial material may be performed prior to or after forming the conductor pattern. They may be performed after forming the conductor pattern as part of the end step 895 or 995. The sacrificial material in the air cavities may be Kapton, PSG material or another sacrificial material that can be selectively etched with respect to the layers of the Bragg reflector, plate and optionally substrate 420 when it is exposed to the air cavities.

Closing Comments

Throughout this description, the embodiments and examples shown should be considered as exemplars, rather than limitations on the apparatus and procedures disclosed or claimed. Although many of the examples presented herein involve specific combinations of method acts or system elements, it should be understood that those acts and those elements may be combined in other ways to accomplish the same objectives. With regard to flowcharts, additional and fewer steps may be taken, and the steps as shown may be combined or further refined to achieve the methods described herein. Acts, elements and features discussed only in connection with one embodiment are not intended to be excluded from a similar role in other embodiments.

As used herein, the pair of terms "top" and "bottom" can be interchanged with the pair "front" and "back". As used herein, "plurality" means two or more. As used herein, a "set" of items may include one or more of such items. As used herein, whether in the written description or the claims, the terms "comprising", "including", "carrying", "having", "containing", "involving", and the like are to be understood to be open-ended, i.e., to mean including but not limited to. Only the transitional phrases "consisting of" and "consisting essentially of", respectively, are closed or semi-closed transitional phrases with respect to claims. Use of ordinal terms such as "first", "second", "third", etc., in the claims to modify a claim element does not by itself connote any priority, precedence, or order of one claim element over another or the temporal order in which acts of a method are performed, but are used merely as labels to distinguish one claim element having a certain name from another element having a same name (but for use of the ordinal term) to distinguish the claim elements. As used herein, "and/or" means that the listed items are alternatives, but the alternatives also include any combination of the listed items.

The invention claimed is:

1. A method of fabricating an acoustic resonator with a Bragg reflector having pedestals and configured to reflect shear acoustic waves at a resonance frequency of the acoustic resonator, comprising:
   forming plural Bragg reflector layers on a top surface of a silicon substrate;
   masking over the plural Bragg reflector layers at a plurality of pedestal locations for the pedestals of the Bragg reflector;
   removing one or more top layers of the Bragg reflector layers from between the pedestal locations to form the pedestals and to form a cavity with a cavity top surface perimeter;
   bonding a top surface of the pedestals and the cavity top surface perimeter to a plate front surface of a piezoelectric plate having the plate front surface, a plate back surface, and a sacrificial substrate bonded to the plate back surface;
   removing the sacrificial substrate from the plate back surface to leave the piezoelectric plate bonded to the pedestals and standing over the cavity; and
   forming at least one conductor pattern on the plate front surface.

2. The method of claim 1, wherein:
   forming plural Bragg reflector layers includes layering a total number of blanket layers that alternate between layers of material having high acoustic impedance and layers of material having low acoustic impedance;
   masking over pedestal locations includes forming a patterned mask over the locations for pedestals and over the cavity top surface perimeter; and
   removing one or more top layers of the Bragg reflector layers includes selectively etching the material having high acoustic impedance and the material having low acoustic impedance.

3. The method of claim 1, wherein masking of over pedestal locations includes patterning a top surface of the Bragg reflector layers;
   wherein removing one or more top layers of the plural Bragg reflector layers comprises performing one or more selective etches of the plural Bragg reflector layers to create air cavities between the pedestals; and
   wherein the cavity top surface perimeter has the plural Bragg reflector layers disposed around the cavity.

4. The method of claim 3, wherein bonding the pedestals to the piezoelectric plate includes mounting a piezoelectric plate back surface onto the Bragg reflector top surface except for a portion of the piezoelectric plate disposed over the air cavities.

5. The method of claim 4, further comprising:
   prior to bonding the piezoelectric plate, forming a sacrificial material in the air cavities; and
   after forming the conductor pattern, forming the holes in a substrate perimeter beside the piezoelectric plate, and etching away the sacrificial material in the air cavities through the holes.

6. The method of claim 1, wherein:
the Bragg reflector has the pedestals in a pedestal portion and has a mirror portion;
removing one or more top layers of the plural Bragg reflector layers includes leaving the mirror portion of Bragg reflector layers; and
the Bragg reflector is configured to reflect shear acoustic waves at a resonance frequency of the acoustic resonator.

7. The method of claim 1, wherein removing the sacrificial substrate includes selectively etching away a material of the sacrificial substrate with respect to the plate and the silicon substrate to leave a piezoelectric membrane fixed on the pedestals and standing over the cavity.

8. The method of claim 7, wherein forming at least one conductor pattern comprises forming an interdigital transducer (IDT) with interleaved fingers disposed on the membrane to form a diaphragm over a cavity.

9. The method of claim 8, wherein:
the piezoelectric plate and the conductor pattern are configured such that radio frequency signals applied to the conductor pattern excites a primary shear acoustic mode in the piezoelectric plate over the cavity, wherein a thickness of the diaphragm is selected to tune the primary shear acoustic modes in the piezoelectric plate.

10. The method of claim 8, wherein the pedestals are each formed from two or more of the plural Bragg reflector layers; support the back surface of the piezoelectric plate opposite the interleaved fingers of the IDT; and are attached to the diaphragm at locations under where the interleaved fingers are disposed on the membrane.

11. A method of fabricating an acoustic resonator with a Bragg reflector having pedestals and configured to reflect shear acoustic waves at a resonance frequency of the acoustic resonator, comprising:
forming plural pedestal portion Bragg reflector layers on a bottom surface of a piezoelectric plate, the piezoelectric plate having a plate front surface, a plate back surface, and a sacrificial substrate bonded to the plate back surface;
masking over the plural pedestal portion Bragg reflector layers at pedestal locations for the pedestals;
removing all of the plural pedestal portion Bragg reflector layers from between the pedestal locations to form the pedestals and to form a cavity with a cavity top surface perimeter;
forming plural mirror portion Bragg reflector layers on a top surface of a silicon substrate;
bonding a bottom surface of the pedestals formed on the plate having the substrate to a top surface of the mirror portion;
removing the sacrificial substrate from the plate back surface to leave a piezoelectric membrane bonded to the pedestals and standing over the cavity; and
forming at least one conductor pattern on the plate front surface.

12. The method of claim 11, wherein:
forming the plural pedestal portion and plural mirror portion Bragg reflector layers each include layering a number of layers that alternate between layers of material having high acoustic impedance and layers of material having low acoustic impedance;
masking over pedestal locations includes forming a patterned mask over the locations for pedestals and over the cavity top surface perimeter; and
removing all of the plural pedestal portion Bragg reflector layers includes performing selective etches with respect to the material having high acoustic impedance and the material having low acoustic impedance.

13. The method of claim 11, wherein masking of over pedestal locations includes patterning a top surface of the plural pedestal portion Bragg reflector layers;
wherein removing all the plural pedestal portion Bragg reflector layers comprises performing one or more selective etches of the plural Bragg reflector layers to create air cavities between the pedestals; and
wherein the cavity top surface perimeter has the plural pedestal portion Bragg reflector layers disposed around the cavity.

14. The method of claim 13, further comprising:
prior to bonding the piezoelectric plate, forming a sacrificial material in the air cavities; and
after forming the conductor pattern, forming the holes in a substrate perimeter beside the piezoelectric plate, and etching away the sacrificial material in the air cavities through the holes.

15. The method of claim 11, wherein forming at least one conductor pattern comprises forming an interdigital transducer (IDT) with interleaved fingers disposed on the membrane to form a diaphragm over the cavity;
wherein the piezoelectric plate and the conductor pattern are configured such that radio frequency signals applied to the conductor pattern excites a primary shear acoustic mode in the piezoelectric plate over the cavity, wherein a thickness of the diaphragm is selected to tune the primary shear acoustic modes in the piezoelectric plate; and
wherein the Bragg reflector is configured to reflect shear acoustic waves at a resonance frequency of the acoustic resonator.

16. A method of fabricating an acoustic resonator with a Bragg reflector having pedestals and configured to reflect shear acoustic waves at a resonance frequency of the acoustic resonator, comprising:
forming plural Bragg reflector layers on a bottom surface of a piezoelectric plate, the piezoelectric plate having a plate front surface, a plate back surface, and a sacrificial substrate bonded to the plate back surface;
masking over the plural Bragg reflector layers at a plurality of pedestal locations for the pedestals of the Bragg reflector;
removing all of the plural layers of the Bragg reflector layers from between the pedestal locations and from a perimeter of a cavity location to form the pedestals;
forming a substrate cavity in a top surface of a silicon substrate; then
bonding a bottom surface of the pedestals to a top surface of the substrate cavity;
removing the sacrificial substrate from the plate back surface to leave a piezoelectric membrane bonded to the pedestals and standing over the substrate cavity; and
forming at least one conductor pattern on the plate front surface.

17. The method of claim 16, wherein bonding includes bonding a perimeter of the substrate cavity top surface to a bottom surface of the plate at the perimeter of the cavity location.

18. The method of claim 16, wherein:
forming plural Bragg reflector layers includes blanket layering a number of blanket layers that alternate between layers of material having high acoustic impedance and layers of material having low acoustic impedance;

masking over pedestal locations includes forming a patterned mask over the locations for pedestals but not over the perimeter of the cavity location; and removing includes performing selective etches with respect to the material having high acoustic impedance and the material having low acoustic impedance.

19. The method of claim 16, wherein masking of over pedestal locations includes patterning a top surface of the pedestal portion Bragg reflector layers;

wherein removing all the plural Bragg reflector layers comprises performing one or more selective etches of the plural Bragg reflector layers to create air cavities between the pedestals; and wherein the perimeter of the substrate cavity top surface has the substrate material disposed around the cavity.

20. The method of claim 16, further comprising:

prior to bonding, forming a sacrificial material in the air cavities; and after forming the conductor pattern, forming the holes in a silicon substrate perimeter beside the piezoelectric plate, and etching away the sacrificial material in the air cavities through the holes.

21. The method of claim 16, wherein forming at least one conductor pattern comprises forming an interdigital transducer (IDT) with interleaved fingers disposed on the membrane to form a diaphragm over the cavity;

wherein the piezoelectric plate and the conductor pattern are configured such that radio frequency signals applied to the conductor pattern excites a primary shear acoustic mode in the piezoelectric plate over the cavity, wherein a thickness of the diaphragm is selected to tune the primary shear acoustic modes in the piezoelectric plate; and wherein the Bragg reflector is configured to reflect shear acoustic waves at a resonance frequency of the acoustic resonator.

* * * * *